(12) United States Patent
Maruyama et al.

(10) Patent No.: US 7,408,820 B2
(45) Date of Patent: Aug. 5, 2008

(54) NONVOLATILE SEMICONDUCTOR MEMORY WITH VIRTUAL GROUND ARRAY

(75) Inventors: Takafumi Maruyama, Osaka (JP); Kazuyuki Kouno, Osaka (JP); Akifumi Kawahara, Kyoto (JP); Yasuhiro Tomita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 103 days.

(21) Appl. No.: 11/641,951

(22) Filed: Dec. 20, 2006

(65) Prior Publication Data
US 2007/0183240 A1 Aug. 9, 2007

(30) Foreign Application Priority Data
Dec. 22, 2005 (JP) ............... 2005-369656

(51) Int. Cl.
*G11C 11/34* (2006.01)
(52) U.S. Cl. ............... 365/189.16; 365/185.2; 365/185.05; 365/185.18
(58) Field of Classification Search ............ 365/185.16, 365/185.2, 185.18, 185.05
See application file for complete search history.

(56) References Cited

U.S. PATENT DOCUMENTS

| | | | | |
|---|---|---|---|---|
| 6,570,790 | B1 * | 5/2003 | Harari | ............... 365/185.29 |
| 6,909,639 | B2 * | 6/2005 | Park et al. | ............... 365/185.25 |
| 7,154,783 | B2 * | 12/2006 | Lee et al. | ............... 365/185.11 |
| 2003/0058712 | A1 | 3/2003 | Yamamoto et al. | |
| 2003/0235080 | A1 * | 12/2003 | Yaegashi et al. | ....... 365/185.22 |
| 2005/0088878 | A1 | 4/2005 | Eshel | |
| 2005/0185501 | A1 * | 8/2005 | Lee et al. | .................. 365/238.5 |
| 2005/0232024 | A1 | 10/2005 | Atir et al. | |

FOREIGN PATENT DOCUMENTS

| | | |
|---|---|---|
| JP | 2002-118182 A | 4/2002 |
| JP | 2003-22684 A | 1/2003 |

* cited by examiner

*Primary Examiner*—Tuan T. Nguyen
(74) *Attorney, Agent, or Firm*—McDermott Will & Emery LLP

(57) ABSTRACT

A nonvolatile semiconductor memory of virtual ground array in which a common connection of the sources and a common connection of the drains of nonvolatile memory cells arranged in rows and columns in a memory cell array are used as bit lines, the nonvolatile memory cells including: a reference cell from which a characteristic used as a reference in a differential readout determination operation is obtained; and a neighbor cell at one side of the reference cell, the neighbor cell sharing one of the source and the drain of the reference cell and being connected to a word line which is connected to the reference cell, wherein the nonvolatile semiconductor memory includes a neighbor cell programming circuit to set the neighbor cell to a programmed state when the word line is activated to set the reference cell to a conduction state, the neighbor cell being kept in a non-conduction state during the programmed state.

10 Claims, 23 Drawing Sheets

NONVOLATILE SEMICONDUCTOR MEMORY WITH VIRTUAL GROUND ARRAY

BACKGROUND OF THE INVENTION

1. Field of the Invention

The present invention relates to a semiconductor memory with virtual ground array (VGA) system developed for the aim of reducing chip area in which, for example, a common connection of the sources and a common connection of the drains of memory cells are used as bit lines, and the source or the drain is shared by adjacent memory cells to reduce the number of drain contacts or source contacts and to greatly reduce the chip area. Specifically, the present invention relates to a semiconductor memory or the like in which stabilized reading is realized in such a manner that when a characteristic used as a reference in a differential readout determination operation is obtained from a memory cell (reference cell) of a memory cell array, variation in the characteristic is suppressed.

2. Description of the Prior Art

Since the VGA structure can adopt a memory array structure having extremely good area efficiency, the VGA structure is used as a way to realize a large capacity memory (for example, see FIG. 1 of the specification of United States Laid-Open Patent Publication No. 2005/0088878). Here, in order to reduce leakage of cell current into a neighbor cell (hereinafter referred to as neighbor effect) in sense operation caused by a common connection of the drains and a common connection of the sources, a technique is adopted which involves applying a voltage to the source of the neighbor cell in a source side sense operation (FIG. 5B in the specification of United States Laid-Open Patent Publication No. 2005/0088878). Also in a drain side sense operation, a technique is also adopted in which a voltage being the same as the drain voltage of the relevant cell is applied to the drain of the neighbor cell (see FIG. 2 of Japanese Laid-Open Patent Publication No. 2003-22684).

The above-mentioned VGA structure can be adopted not only to a main area which stores data, but also to a memory cell (reference cell) from which the characteristic used as a reference in the differential readout determination operation is obtained.

However, it is found that when the conventional VGA structure is used to form such a reference cell as mentioned above, a leakage current via a cell neighboring the reference cell varies in processes, which makes it difficult to realize stable reading.

FIG. 24 shows an algorism for reprogramming and readout operations of a conventional nonvolatile semiconductor memory. When a characteristic used as a reference is obtained from a memory cell (reference cell), programming of the reference cell is first performed in Step 1 such that the reference cell conducts a predetermined reference current. Then, in the reprogramming operation in actual use of the nonvolatile semiconductor memory, an erase operation in Step 2, a programming operation in Step 3, and a readout operation in Step 4 are performed on a main area.

FIG. 23 is a block diagram illustrating the conventional nonvolatile semiconductor memory.

With reference to FIG. 23, the programming of the reference cell in Step 1 will be first explained. A row decoder 3 selects a word line RWL1 to select a reference cell RC12 in a memory cell region 1 in which memories are arranged in an array. In this state, a column decoder 4 drives column selection lines CSp1 and CSp0 to have a logical value of 1, which allows application of voltages V1=Vd and V2=VSS generated in a programming bias circuit 9 respectively to main bit liens RMBL3 and RMBL2 via column selection transistors Cp1 and Cp0. At the same time, selection line driving circuits 2-2 and 2-1 drive block selection lines SEL6 and SEL2 to have a logical value of 1, which allows application of the Vd and the VSS respectively to subbit lines DBL3 and DBL2 via block selection transistors SL12 and SL02. Then, the Vd and the VSS are respectively applied to the source and the drain of the reference cell RC12, and electrons are injected in a charge accumulation region at a subbit line DBL3 side by a hot electron injection method, so that the reference cell is programmed.

Next, the readout operation performed in Step 2, Step 3, and Step 4 using the reference cell will be explained. Likewise, the row decoder 3 selects the word line RWL1 to select the reference cell RC12. In this state, the column decoder 4 drives column selection lines CSr1 and CSr0 to have a logical value of 1, which allows application of a voltage V3=Vb generated in a read bias circuit 7 to the main bit line RMBL2 via a column selection transistor Cr1, and connection of the main bit line RMBL3 to a reference side input of a sense amplifier 6 via a column selection transistor Cr0. At the same time, a column selection line CSn is driven to have a logical value of 1, which allows injection of a current Iadd from a neighbor effect suppression circuit 8 into a bit line RMBL0 via a column selection transistor Cn. At the same time, the selection line driving circuits 2-1 and 2-2 drive the block selection lines SEL2, SEL6, and SEL1 to have a logical value of 1, which allows application of the Vb to the subbit line DBL2 via the block selection transistor SL02, connection of the subbit line DBL3 to the sense amplifier 6 via the block selection transistor SL12, and injection of the current Iadd from the neighbor effect suppression circuit 8 into a subbit line DBL4 via a block selection transistor SL01. In this case, the current Iadd is set to have the same value as that of a leakage current Ines via a neighbor cell RC13 connected to the word line RWL1 which is connected to the reference cell RC12, so that the leakage current via the neighbor cell RC13 does not occur, and thus a cell current Iref of the reference cell RC12 is faithfully input into the sense amplifier 6. That is, the above-mentioned function of the neighbor effect suppression circuit 8 reduces the neighbor effect, which is particular to the VGA structure. Then, as shown in FIG. 25, based on a result from an integration of currents input from a main side and from a reference side, a difference potential between both nodes is differentially determined and the readout operation is performed.

Since in the conventional structure, characteristics of cells, including the neighbor cell RC13 but excepting the reference cell RC12, vary in processes, it is not in all cases possible to completely counterbalance variation in leakage current Ines by the current Iadd. Therefore, reference side input current input to the sense amplifier 6 varies, and a reference side input voltage SA_IN_Ref of the sense amplifier 6 varies in the range of SA_IN_Ref− to SA_IN_Ref+ as shown in the graph in FIG. 25, which disables a stable readout operation.

Explanations have been given with reference to a system in which a cell current is taken at a source side (source sense system). However, in a system in which a cell current is taken at a drain side (drain sense system), a neighbor cell RC11 has similar influence.

SUMMARY OF THE INVENTION

The present invention relates to a semiconductor memory with VGA structure, and an object of the present invention is to realize stabilized reading in such a manner that especially when a characteristic used as a reference in a differential readout determination operation is obtained from a memory cell (reference cell) arranged in part of a memory cell array, variation in the characteristic is suppressed.

To achieve the object, the present invention includes a mechanism for programming a memory cell which neighbors a reference cell. Overviews of representative examples of the invention disclosed in this specification are briefly explained as follows.

A first example includes a selection means for applying a programming potential to the source of a neighbor cell provided at a common source side and a selection means for applying a ground potential to the drain of the neighbor cell. According to the first example, it is possible to reduce variation in neighbor effect in a source side sense system.

A second example includes a selection means for applying a ground potential to the drain of a neighbor cell provided at a common drain side and a selection means for applying a programming potential to the source of the neighbor cell. According to the second example, it is possible to reduce variation in neighbor effect in a drain side sense system.

A third example includes a selection means for applying a programming potential to the source of neighbor cells provided at a common source side and at a common drain side and a selection means for applying a ground potential to the drain of the neighbor cells provided at the common source side and at the common drain side. According to the third example, the circuit scale increases, but it is possible to reduce variation in neighbor effect in a source side sense system, and to improve access time by increasing the drain side charge up speed in a readout operation.

A fourth example includes a selection means for applying a programming potential to the drain of a neighbor cell provided at a common source side and a selection means for applying a ground potential to the source of the neighbor cell. According to the fourth example, it is possible to realize more reduction in variation in neighbor current in a source side sense system.

A fifth example includes a selection means for coupling a sense amplifier to the source of a neighbor cell provided at a common source side and a selection means for applying a readout potential to the drain of the neighbor cell, and involves the operation of verifying the programming threshold value of the neighbor cell. According to the fifth example, the circuit scale increases and the algorism is complex, but it is possible to improve degradation in threshold value (reliability) of the neighbor cell in a source sense system.

A sixth example includes a selection means for coupling a sense amplifier to the drain of a neighbor cell provided at a common drain side and a selection means for applying a ground potential to the source of the neighbor cell, and involves the operation of verifying the programming threshold value of the neighbor cell. According to the sixth example, the circuit scale increases and the algorism is complex, but it is possible to improve degradation in threshold value (reliability) of the neighbor cell in a drain sense system.

A seventh example includes in addition to the means of the fifth example, a mode detection circuit and a gate voltage selection circuit, wherein the programming threshold value of a neighbor cell is set higher only to a neighbor cell which neighbors a reference cell used to verify the programming of a main cell. According to the seventh example, it is possible to optimally improve neighbor effect in verifying the programming.

A eighth example includes in addition to the means of fifth example, a power supply activation detection circuit and a sequencer circuit, wherein a neighbor cell whose threshold value degrades is automatically reprogrammed at the time of power supply activation. According to the eighth example, it is possible to reprogram the neighbor cell after the nonvolatile semiconductor device is put on the market and to facilitate reliability design.

A ninth example includes in addition to the means of the fifth example, an external terminal and a sequencer circuit, wherein a neighbor cell whose threshold value degrades is reprogrammed under external control. According to the ninth example, it is possible to realize the function of the eighth example with a simpler circuit structure although the function is required to be controlled.

A tenth example includes in addition to the means of the fifth example, a decoding means for individually selecting every word line in a memory cell array and for applying a gate voltage in programming to program all neighbor cells connected to a bit line at a common source side. According to the tenth example, it is possible to reduce neighbor effect caused by over erase currents of all the neighbor cells connected to the subbit line at the common source side in the source sense system.

An eleventh example includes in addition to the means of the sixth example, a decoding means for individually selecting every word line in a memory cell array and applying a gate voltage in programming thereto to program all neighbor cells connected to a bit line at a common drain side. According to the eleventh example, it is possible to reduce neighbor effect caused by over erase currents of all the neighbor cells connected to the subbit line at the common drain side in the drain sense system.

A twelfth example includes in addition to the means of the fifth example, a selection means for outputting a current flowing through a common source to the outside. According to the twelfth example, it is possible to facilitate the characteristic evaluation of a neighbor effect current in a source sense system.

A thirteenth example includes in addition to the means of the sixth example, a selection means for outputting a current flowing into a common drain to the outside. According to the thirteenth example, it is possible to facilitate the characteristic evaluation of a neighbor effect current in a drain sense system.

DESCRIPTION OF THE PREFERRED EMBODIMENTS

First, the outline of a nonvolatile semiconductor memory of the present invention will be described. A well-known structure of a memory cell provided in the nonvolatile semiconductor memory is such that the memory cell includes a floating gate between a substrate and a control gate. The memory cell holds binary information depending on whether or not electrons are accumulated in the floating gate. If electrons are accumulated in the floating gate, the threshold value of a gate voltage applied to the control gate increases. Therefore, even with the application of a predetermined gate voltage, a current does not practically flow through the memory cell. This state is defined as such that "0" is stored. Contrary to this, if electrons are not accumulated in the floating gate, the threshold value of the gate voltage decreases. Therefore, if a predetermined gate voltage is applied to the control gate, a current flows through the memory cell. This state is defined as such that "1" is stored. In this case, a state where electrons are not accumulated is referred to as an erased state "1", and a state where electrons are accumulated is referred to as a written state "0". Moreover, the present invention is applicable not only to a memory cell including a floating gate, but also to a memory cell including a MONOS structure in which electrons are accumulated in a trap in a nitride film to hold memories, the nitride film being an insulation film provided between oxide films.

Embodiment 1

The overview of a nonvolatile semiconductor memory of Embodiment 1 of the present invention will be described below with reference to the drawings. According to the nonvolatile semiconductor memory of Embodiment 1, it is possible to reduce variation in neighbor effect in a source side sense system.

Figure 2:
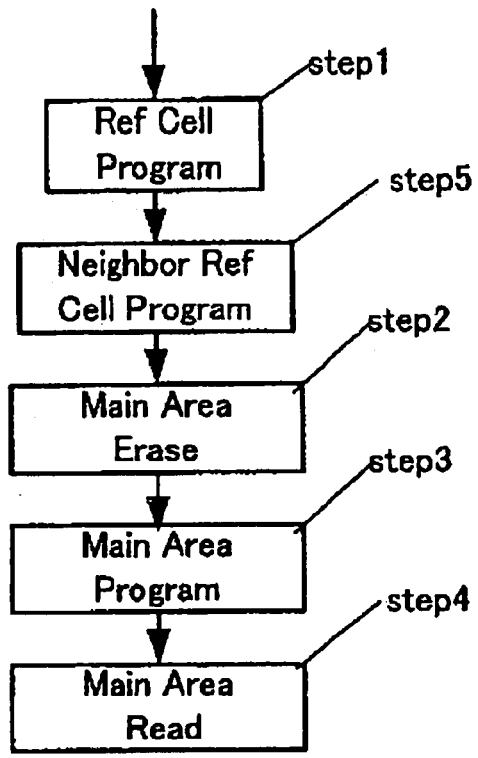
FIG. 2 shows an exemplary algorism for reprogramming and readout operations by the nonvolatile semiconductor memory of Embodiments 1, 2, 3, and 4 of the present invention.

FIG. 2 shows an exemplary algorism for reprogramming and readout operations of Embodiment 1 of the present invention. Programming of a reference cell is first performed in Step 1 such that the reference cell conducts a predetermined reference current. Subsequently, programming of a neighbor cell of the reference cell is performed in Step 5. Then, in a reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Step 5 is performed immediately after Step 1. However, Step 5 may be performed whenever before Step 2.

Figure 1:
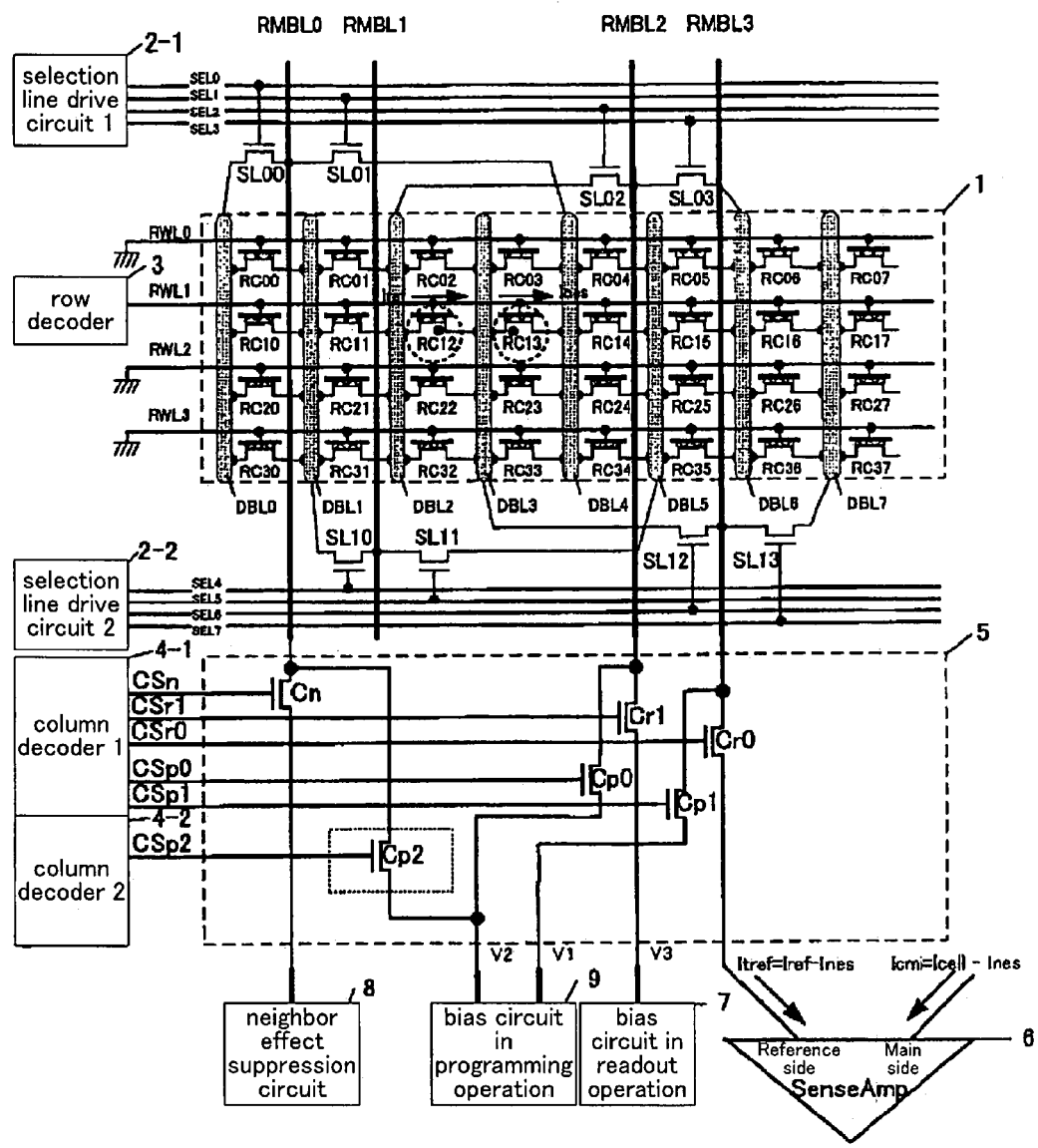
FIG. 1 is a block diagram illustrating a nonvolatile semiconductor memory of Embodiment 1 of the present invention.

FIG. 1 is a block diagram illustrating the nonvolatile semiconductor memory of Embodiment 1 of the present invention.

Since the programming of the reference cell in Step 1 and the readout operation in Step 2, Step 3, and Step 4 using the reference cell are the same as those described in the conventional example, descriptions thereof with reference to FIG. 1 are omitted, but the programming of the neighbor reference cell performed in Step 5 will be described with reference to FIG. 1. A row decoder 3 selects a word line RWL1 to select a neighbor reference cell RC13 arranged in an array in a memory cell region 1. In this state, a column decoder 4 drives column selection lines CSp1 and CSp2 to have a logical value of 1, which allows application of voltages V1=Vd and V2=VSS generated in a programming bias circuit 9 respectively to main bit lines RMBL3 and RMBL0 via column selection transistors Cp1 and Cp2. At the same time, selection line drive circuits 2-2 and 2-1 drive block selection lines SEL6 and SEL1 to have a logical value of 1, which allows application of the Vd and the VSS respectively to subbit lines DBL3 and DBL4 via block selection transistors SL12 and SL01. Then, the Vd and the VSS are respectively applied to the source and the drain of the neighbor reference cell RC13, and electrons are injected in a charge accumulation region at a subbit line DBL3 side by a hot electron injection method, so that the neighbor reference cell is programmed.

Figure 3:
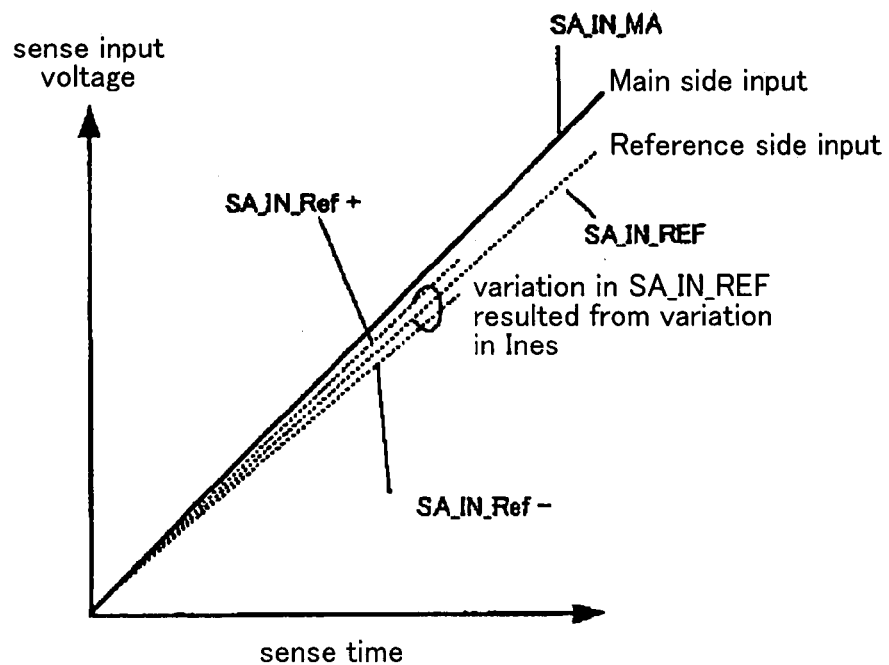
FIG. 3 is a graph with which a readout determination operation of the nonvolatile semiconductor memory of Embodiments 1, 3 and 4 of the present invention is explained.

As described above, in the structure of Embodiment 1 of the present invention, the neighbor cell RC13 is programmed, which makes it possible to reduce a leakage current Ines in the readout operation performed in Step 2, Step 3, and Step 4 using the reference cell. Therefore, after the leakage current Ines is counterblanaced by a current Iadd from a neighbor effect suppression circuit 8, variation in reference side input current to a sense amplifier 6 is reduced, and variation in reference side input voltage SA_IN_Ref to the sense amplifier 6 is also reduced as shown in the graph in FIG. 3. In this way, it is possible to realize a stable readout operation.

Note that, since programming of the neighbor reference cell RC13 can reduce the leakage current as explained above, it is not necessary to provide the neighbor effect suppression circuit 8. If the neighbor effect suppression circuit 8 is not provided, it is possible to reduce power consumption.

Embodiment 2

The overview of a nonvolatile semiconductor memory of Embodiment 2 of the present invention will be described below with reference to the drawings. According to the nonvolatile semiconductor memory of Embodiment 2, it is possible to reduce variation in neighbor effect in a drain side sense system.

FIG. 2 shows an exemplary algorism for reprogramming and readout operations of Embodiment 2 of the present invention. Programming of a reference cell is first performed in Step 1 such that the reference cell conducts a predetermined reference current. Subsequently, programming of a neighbor cell of the reference cell is performed in Step 5. Then, in a reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Step 5 is performed immediately after Step 1. However, Step 5 may be performed whenever before Step 2.

Figure 4:
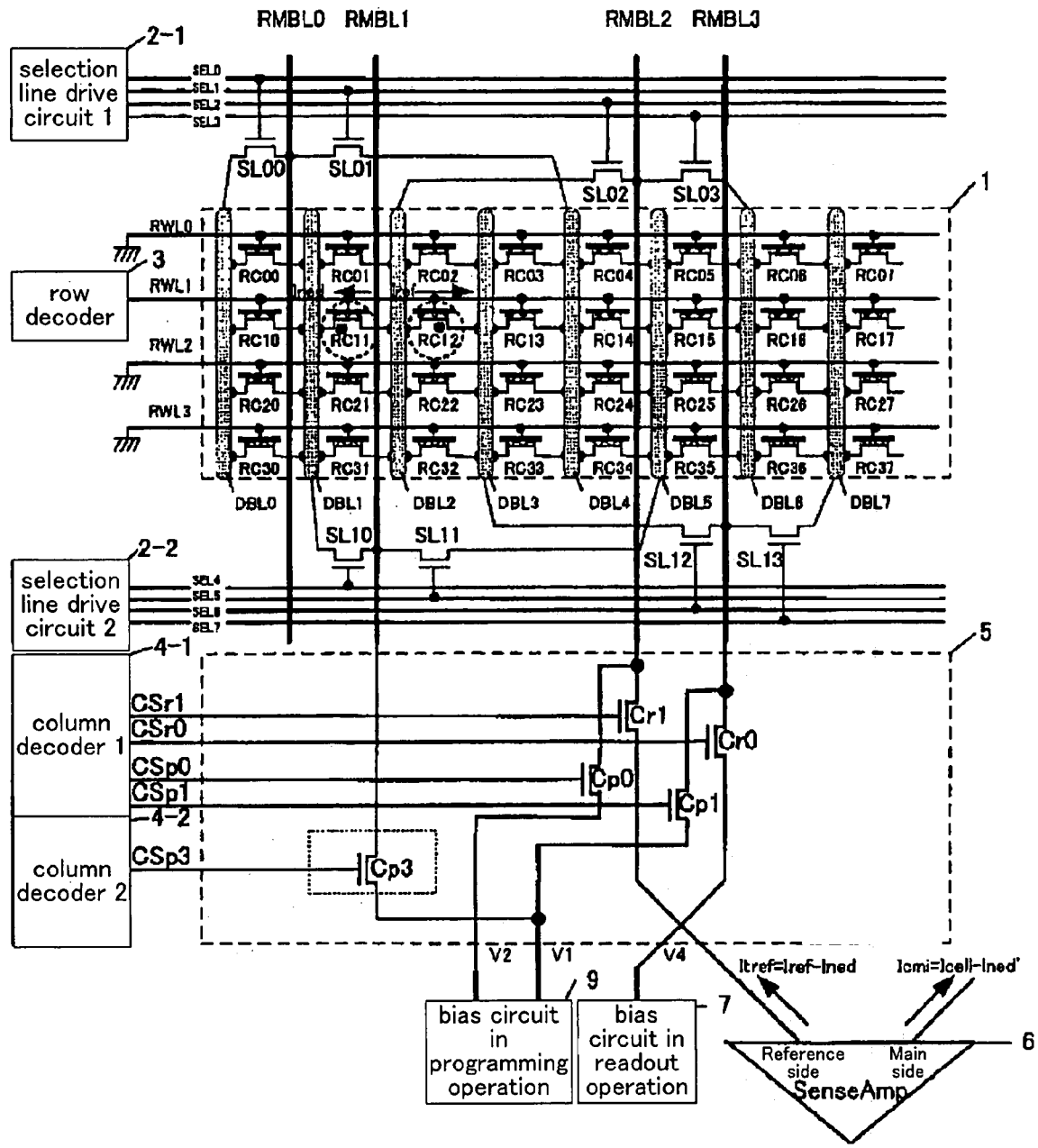
FIG. 4 is a block diagram illustrating the nonvolatile semiconductor memory of Embodiment 2 of the present invention.

FIG. 4 is a block diagram illustrating the nonvolatile semiconductor memory of Embodiment 2 of the present invention.

Since the programming of the reference cell in Step 1 is the same as that in the conventional example, a description thereof with reference to FIG. 4 is omitted.

First, the programming of the neighbor reference cell performed in Step 5 will be described. A row decoder 3 selects a word line RWL1 to select a neighbor reference cell RC11 arranged in an array in a memory cell region 1. In this state, a column, decoder 4 drives column selection lines CSp3 and CSp0 to have a logical value of 1, which allows application of voltages V1=Vd and V2=VSS generated in a programming bias circuit 9 respectively to main bit lines RMBL1 and RMBL2 via column selection transistors Cp3 and Cp0. At the same time, selection line drive circuits 2-2 and 2-1 drive block selection lines SEL4 and SEL2 to have a logical value of 1, which allows application of the Vd and the VSS respectively to subbit lines DBL1 and DBL2 via block selection transistors SL10 and SL02. Then, the Vd and the VSS are respectively applied to the source and the drain of the neighbor reference cell RC11, and electrons are injected in a charge accumulation region at a subbit line DBL1 side by a hot electron injection method, so that the neighbor reference cell is programmed.

Figure 5:
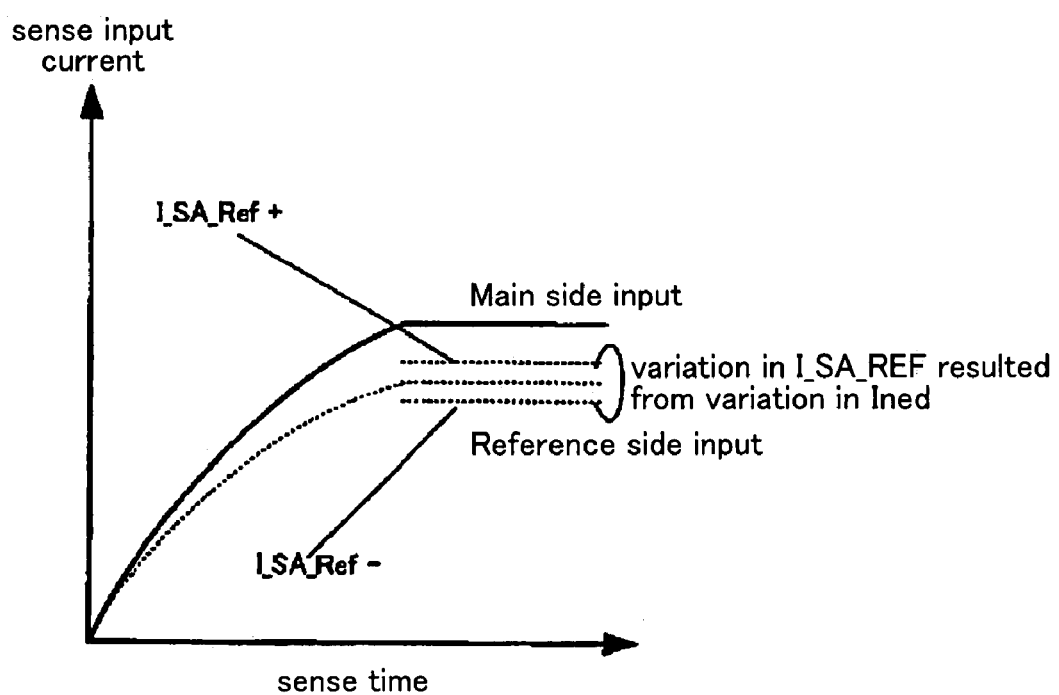
FIG. 5 is a graph with which a readout determination operation of the nonvolatile semiconductor memory of Embodiment 2 of the present invention is explained.

Next, the readout operation in Step 2, Step 3, and Step 4 using the reference cell will be explained. Likewise, the row decoder 3 selects the word line RWL1 to select a reference cell RC12. In this state, the column decoder 4 drives column selection lines CSr1 and CSr0 to have a logical value of 1, which allows connection of the main bit line RMBL2 to a sense amplifier 6 at a reference side via a column selection transistor Cr1, and application of a voltage V4=VSS generated in a readout bias circuit 7 to a main bit line RMBL3 via a column selection transistor Cr0. At the same time, the selection line drive circuits 2-1 and 2-2 drive the block selection lines SEL2 and SEL6 to have a logical value of 1, which allows application of the VSS to a subbit line DBL3 via a block selection transistor SL12, and connection of the subbit line DBL2 to the sense amplifier 6 via the block selection transistor SL02. In this case, since the neighbor cell RC11 has been programmed in Step 5, a leakage current Ined via the neighbor cell RC11 is reduced, the neighbor cell RC11 being connected to the word line RWL1 which is connected to the reference cell RC12. Therefore, process variation in neighbor current is suppressed as shown in the graph in FIG. 5, and a cell current Iref of the reference cell RC12 is faithfully detected by the sense amplifier 6.

As described above, in the structure of Embodiment 2 of the present invention, a neighbor cell in the drain side sense system is programmed, which reduces variation in reference side input current I_SA_Ref to the sense amplifier 6. Therefore, it possible to realize a stable readout operation.

Embodiment 3

The overview of a nonvolatile semiconductor memory of Embodiment 3 of the present invention will be described below with reference to the drawings. According to the nonvolatile semiconductor memory of Embodiment 3, it is possible to reduce variation in neighbor effect in a source side sense system and to improve access time by increasing the drain side charge-up speed.

FIG. 2 shows an exemplary algorism for reprogramming and readout operations of Embodiment 3 of the present invention. Programming of a reference cell is first performed in Step 1 such that the reference cell conducts a predetermined reference current. Subsequently, programming of a neighbor cell of the reference cell is performed in Step 5. Then, in a reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Step 5 is performed immediately after Step 1. However, Step 5 may be performed whenever before Step 2.

Figure 6:
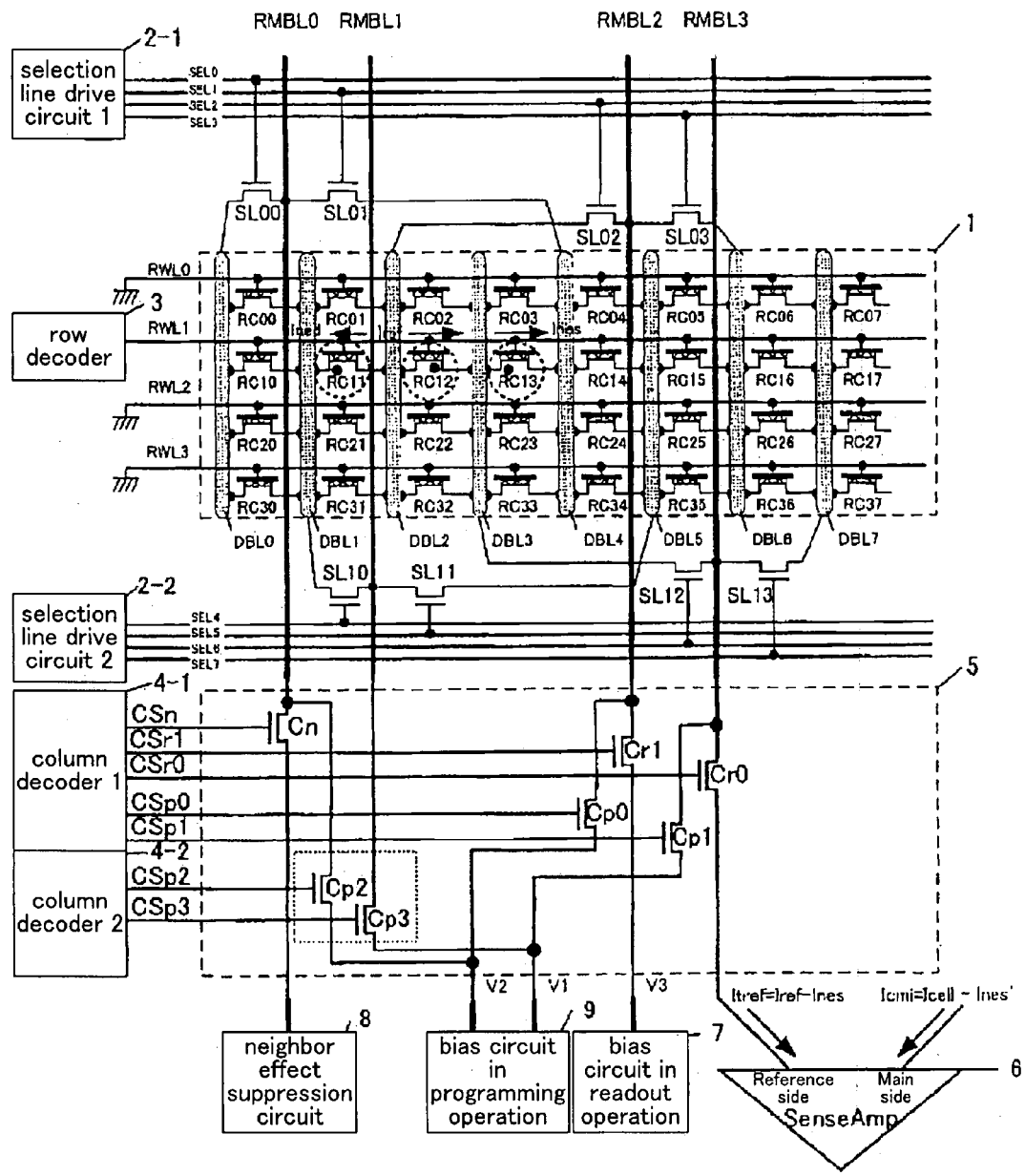
FIG. 6 is a block diagram illustrating the nonvolatile semiconductor memory of Embodiment 3 of the present invention.

FIG. 6 is a block diagram illustrating the nonvolatile semiconductor memory of Embodiment 3 of the present invention.

Since the programming of the reference cell in Step 1 and the readout operation in Step 2, Step 3, and Step 4 using the reference cell are the same as those described in the conventional example, descriptions thereof with reference to FIG. 6 are omitted.

Since in Embodiment 3, both a neighbor cell RC11 and a neighbor cell RC13 are programmed, a circuit structure of Embodiment 3 includes column selection transistors Cp2 and Cp3 for which selection signals CSp2 and CSp3 are output from a column decoder 4-2. Programming the neighbor cells RC11 and RC13 using these circuits in neighbor reference cell programming operation in Step 5 reduces a drain side leakage current Ined and a source side leakage current Ines of a reference cell RC12. Reducing the drain side leakage current Ined makes it possible to shorten set-up time of a drain voltage Vd applied from a readout bias circuit 7. Moreover, reducing the source side leakage current Ines makes it possible to reduce variation in reference side input current to a sense amplifier 6.

As described above, the structure of Embodiment 3 of the present invention includes an additional column selection mechanism for programming both of the neighbor cells. In this structure, it is possible to improve access time by increasing the drain side charge-up speed as well as to reduce variation in neighbor effect in the source side sense system.

Note that, such a structure as mentioned above may be applied to the drain side sense system as shown in FIG. 4.

Embodiment 4

The overview of a nonvolatile semiconductor memory of Embodiment 4 of the present invention will be described below with reference to the drawings. According to the nonvolatile semiconductor memory of Embodiment 4, it is possible to reduce variation in neighbor effect in a source side sense system especially in a memory cell employing MONOS structure in which electrons are accumulated in a trap in a nitride film to hold memories, a nitride film being an insulation film provided between oxide films.

FIG. 2 shows an exemplary algorism for reprogramming and readout operations of Embodiment 4 of the present invention. Programming of a reference cell is first performed in Step 1 such that the reference cell conducts a predetermined reference current. Subsequently, programming of a neighbor cell of the reference cell is performed in Step 5. Then, in a reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Step 5 is performed immediately after Step 1. However, Step 5 may be performed whenever before Step 2.

Figure 7:
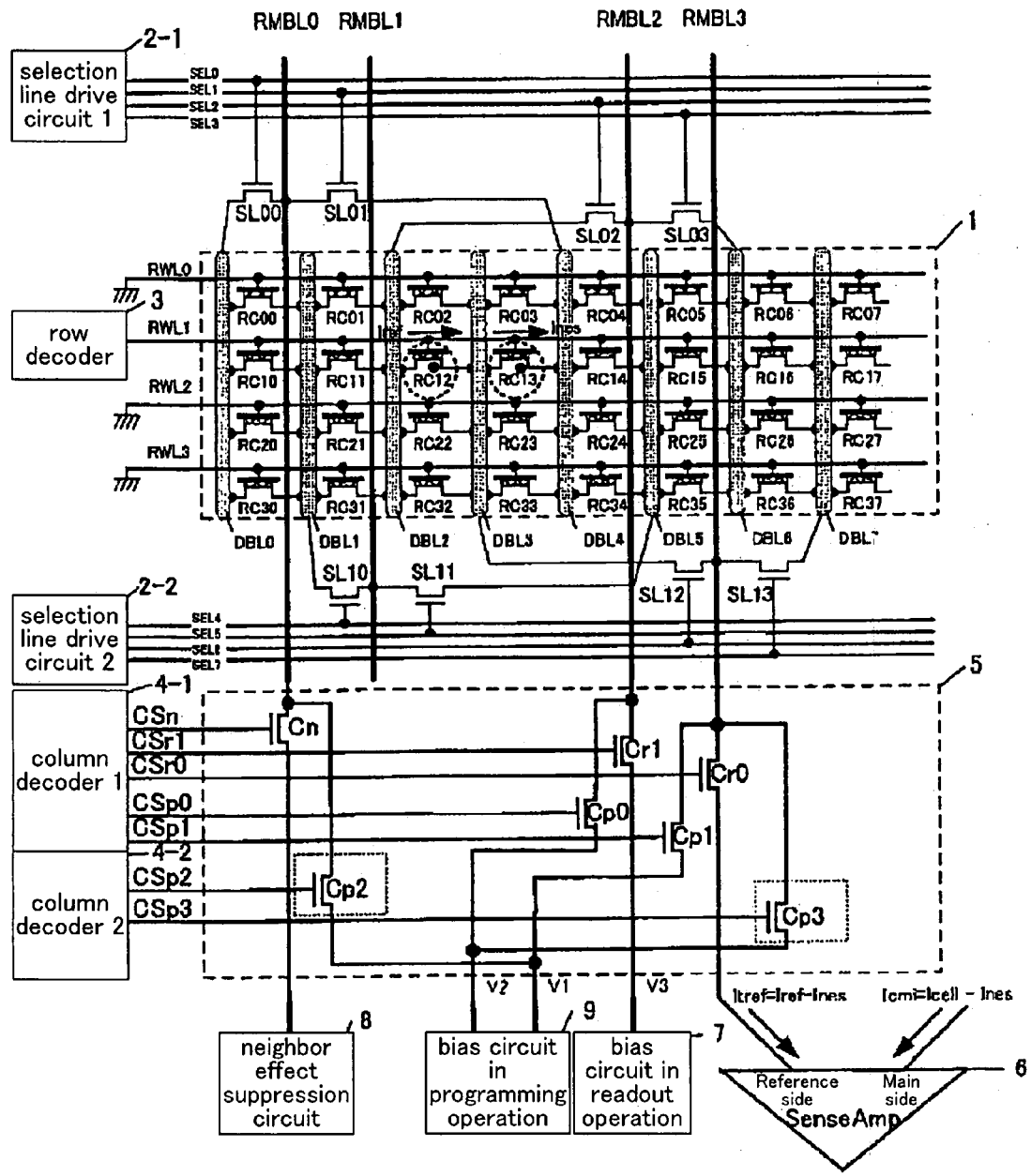
FIG. 7 is a block diagram illustrating the nonvolatile semiconductor memory of Embodiment 4 of the present invention.

FIG. 7 is a block diagram illustrating the nonvolatile semiconductor memory of Embodiment 4 of the present invention.

Since the programming of the reference cell in Step 1 and the readout operation in Step 2, Step 3, and Step 4 using the reference cell are the same as those described in the conventional example, descriptions thereof with reference to FIG. 7 are omitted.

The programming of the neighbor reference cell performed in Step 5 will be described. A row decoder 3 selects a word line RWL1 to select a neighbor reference cell RC13 arranged in an array in a memory cell region 1. In this state, a column decoder 4 drives column selection lines CSp2 and CSp3 to have a logical value of 1, which allows application of voltages V1=Vd and V2=VSS generated in a programming bias circuit 9 respectively to main bit lines RMBL0 and RMBL3 via column selection transistors Cp2 and Cp3. At the same time, selection line drive circuits 2-2 and 2-1 drive block selection lines SEL1 and SEL6 to have a logical value of 1, which allows application of the Vd and the VSS respectively to subbit lines DBL4 and DBL3 via block selection transistors SL01 and SL12. Then, the VSS and the Vd are respectively applied to the source and the drain of the neighbor reference cell RC13, and electrons are injected in a charge accumulation region at a subbit line DBL4 side by a hot electron injection method, so that the neighbor reference cell is programmed.

A memory cell employing MONOS structure includes two charge accumulation regions at a subbit line DBL3 side and a subbit line DBL4 side, and in terms of reduction in neighbor effect, it is preferable that charges are accumulated at the subbit line DBL4 side. Therefore, as described above, Embodiment 4 of the present invention includes an additional column selection transistor compared to Embodiment 1. However, in Embodiment 4, it is possible to realize more reduction in variation in reference side input voltage SA_IN_Ref to a sense amplifier 6 as shown in the graph in FIG. 3 and to realize a more stable readout operation.

Embodiment 5

The overview of a nonvolatile semiconductor memory of Embodiment 5 of the present invention will be described below with reference to the drawings. The nonvolatile semiconductor memory of Embodiment 5 includes a circuit for verifying the programming threshold value of a neighbor cell and involves a verification action, with which it is possible to improve degradation in threshold value (reliability) of the neighbor cell in a source sense system.

Figure 9:
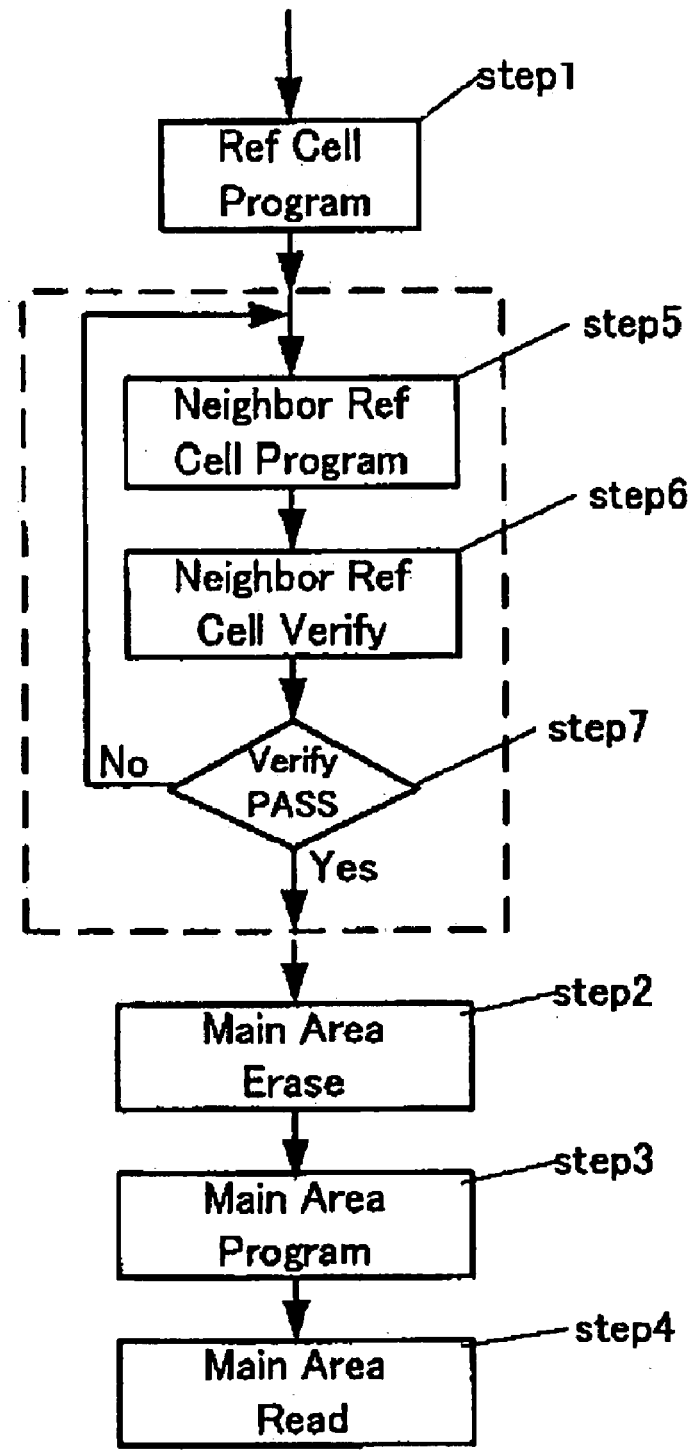
FIG. 9 shows an exemplary algorism for reprogramming and readout operations by the nonvolatile semiconductor memory of Embodiments 5 and 6 of the present invention.

FIG. 9 shows an exemplary algorism for reprogramming and readout operations of Embodiment 5 of the present invention. Programming of a reference cell is first performed in Step 1 such that the reference cell conducts a predetermined reference current. Subsequently, programming of a neighbor cell of the reference cell is performed in Step 5, and the programming of Step 5 is verified in Step 6 and determined in Step 7. Then, in the reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Steps 5 through 7 are performed immediately after Step 1. However, Steps 5 through 7 may be performed whenever before Step 2.

Figure 8:
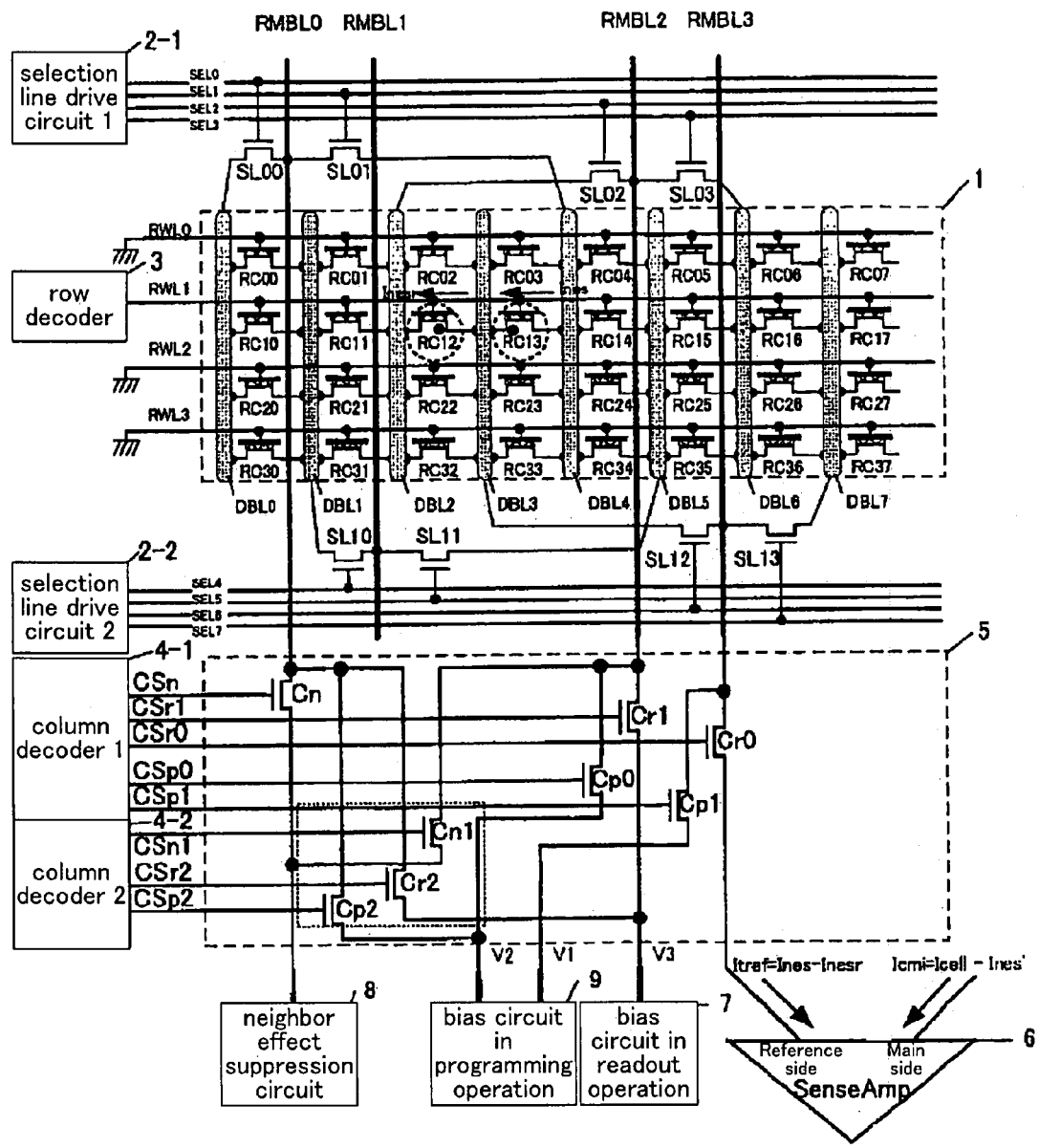
FIG. 8 is a block diagram illustrating a nonvolatile semiconductor memory of Embodiment 5 of the present invention.

FIG. 8 is a block diagram illustrating the nonvolatile semiconductor memory of Embodiment 5 of the present invention.

Since the programming of the reference cell in Step 1, the readout operation in Step 2, Step 3, and Step 4 using the reference cell, and the programming of the neighbor cell in Step 5 are the same as those described in Embodiment 1, descriptions thereof with reference to FIG. 8 are omitted.

First, verification of the programming of the neighbor reference cell in Step 6 will be explained. A row decoder 3 selects a word line RWL1 to select a neighbor cell RC13. In this state, a column decoder 4 drives column selection lines CSr2 and CSr0 to have a logical value of 1, which allows application of a voltage V3=Vb generated in a readout bias circuit 7 to a main bit line RMBL0 via a column selection transistor Cr2 and connection of a main bit line RMBL3 to a reference side input of a sense amplifier 6 via a column selection transistor Cr0. At the same time, a column selection line CSn1 is driven to have a logical value of 1, which allows injection of a current from a neighbor effect suppression circuit 8 to a main bit line RMBL2 via a column selection transistor Cn1. At the same time, selection line drive circuits 2-1 and 2-2 drive block selection lines SEL2, SEL6, and SEL1 to have a logical value of 1, which allows application of the Vb to a subbit line DBL4 via a block selection transistor SL01, connection of a subbit line DBL3 to the sense amplifier 6 via a block selection transistor SL12, and injection of the current from the neighbor effect suppression circuit 8 to a subbit line DBL2 via a block selection transistor SL02. In this way, the sense amplifier 6 differentially determines a difference potential between both nodes according to current input values at a main side and a reference side to determine the programming threshold value of the neighbor cell.

Next, if it is determined in Step 7 that the verification of Step 6 shows a success of the programming, the process proceeds to Step 2, but if it is determined in Step 7 that the verification of Step 6 shows a failure of the programming, Step 5 is performed again.

As described above, in Embodiment 5 of the present invention, the programming of the neighbor cell in the source sense system is verified and determined to prevent overprogramming of the neighbor cell, which makes it possible to improve the degradation in threshold value (reliability) of the neighbor cell in the source sense system.

Embodiment 6

The overview of a nonvolatile semiconductor memory of Embodiment 6 of the present invention will be described below with reference to the drawings. The nonvolatile semiconductor memory of Embodiment 6 includes a circuit for verifying the programming threshold value of a neighbor cell and involves a verification action, with which it is possible to improve degradation in threshold value (reliability) of the neighbor cell in a drain sense system.

FIG. 9 shows an exemplary algorism for reprogramming and readout operations of Embodiment 6 of the present invention. Programming of a reference cell is first performed in Step 1 such that the reference cell conducts a predetermined reference current. Subsequently, programming of a neighbor cell of the reference cell is performed in Step 5, and the programming of Step 5 is verified in Step 6 and determined in Step 7. Then, in the reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Steps 5 through 7 are performed immediately after Step 1. However, Steps 5 through 7 may be performed whenever before Step 2.

Figure 10:
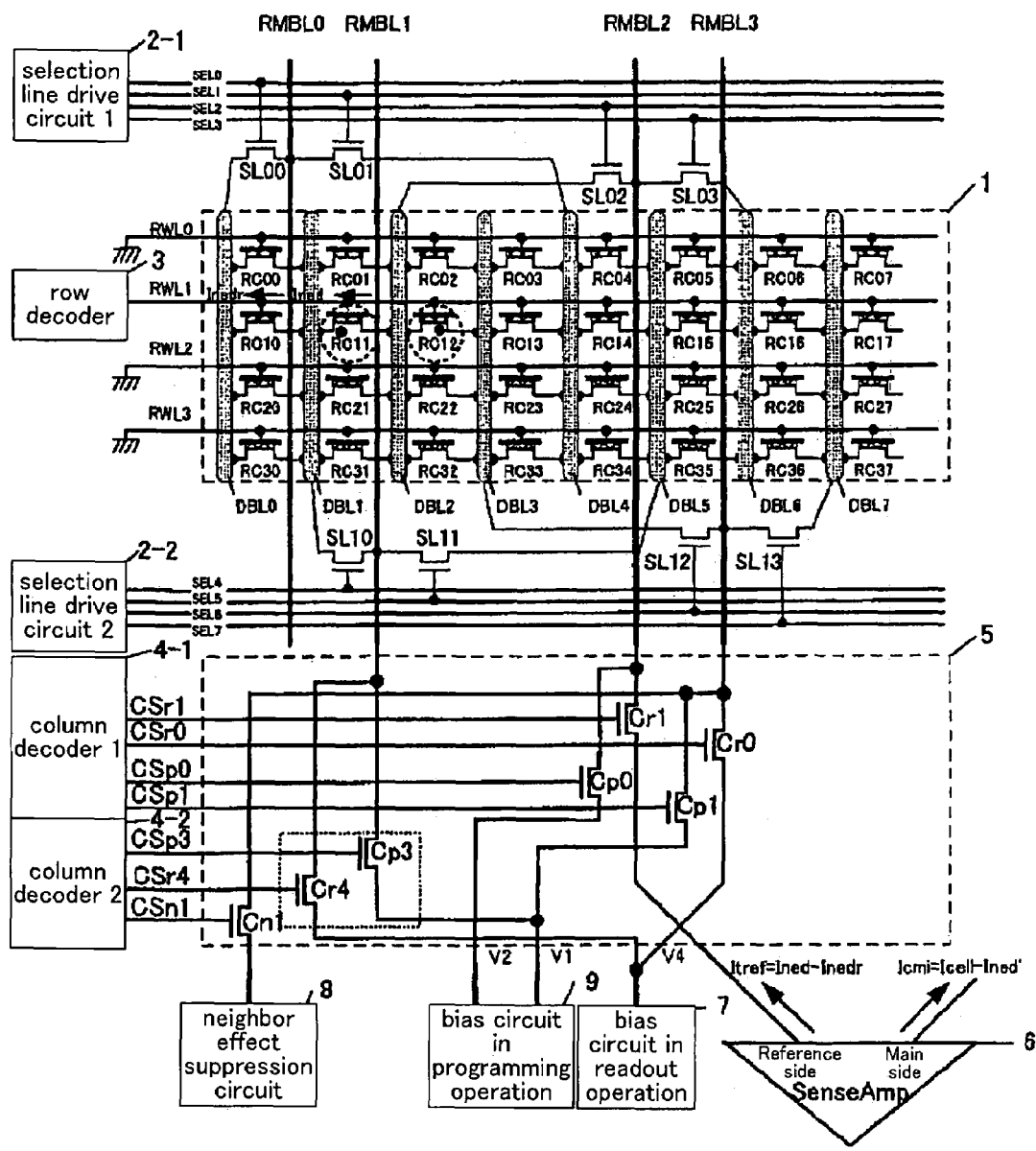
FIG. 10 is a block diagram illustrating the nonvolatile semiconductor memory of Embodiment 6 of the present invention.

FIG. 10 is a block diagram illustrating the nonvolatile semiconductor memory of Embodiment 6 of the present invention.

Since the programming of the reference cell in Step 1, the readout operation in Step 2, Step 3, and Step 4 using the reference cell, and the programming of the neighbor cell in Step 5 are the same as those described in Embodiment 2, descriptions thereof with reference to FIG. 10 are omitted.

First, verification of the programming of the neighbor reference cell in Step 6 will be explained. A row decoder 3 selects a word line RWL1 to select a neighbor cell RC11. In this state, a column decoder 4 drives column selection lines CSr1 and CSr4 to have a logical value of 1, which allows connection of a main bit line RMBL2 to a reference side input of a sense amplifier 6 via a column selection transistor Cr1 and application of a voltage V4=VSS generated in a readout bias circuit 7 to a main bit line RMBL1 via a column selection transistor Cr4. At the same time, a column selection line CSn1 is driven to have a logical value of 1, which allows injection of a current from a neighbor effect suppression circuit 8 to a main bit line RMBL3 via a column selection transistor Cn1. At the same time, selection line drive circuits 2-1 and 2-2 drive block selection lines SEL2, SEL4, and SEL6 to have a logical value of 1, which allows connection of a subbit line DBL2 to the sense amplifier 6 via a block selection transistor SL02, application of the VSS to a subbit line DBL1 via a block selection transistor SL10, and injection of the current from the neighbor effect suppression circuit 8 to a subbit line DBL3 via a block selection transistor SL12. In this way, the sense amplifier 6 differentially determines a difference potential between both nodes according to current values at the main side and at the reference side to determine the programming threshold value of the neighbor cell.

Next, if it is determined in Step 7 that the verification in Step 6 shows a success of the programming, the process proceeds to Step 2, but if it is determined in Step 7 that the verification in Step 6 shows a failure of the programming, Step 5 is performed again.

As described above, in Embodiment 6 of the present invention, the programming of the neighbor cell in the drain sense system is verified and determined to prevent overprogramming of the neighbor cell, which makes it possible to improve the degradation in threshold value (reliability) of the neighbor cell in the drain sense system.

Embodiment 7

The overview of nonvolatile semiconductor memory of Embodiment 7 of the present invention will be described below with reference to the drawings. The nonvolatile semiconductor memory of Embodiment 7 includes a mode detection circuit and a gate voltage selection circuit, which enables setting of the programming threshold values of neighbor cells to different values according to types of reference cells which the neighbor cells neighbor, and thus optimization of reliability and neighbor effect is possible.

Here, setting methods of a readout-operation use reference cell and a programming-verification use reference cell will be explained.

Figure 12:
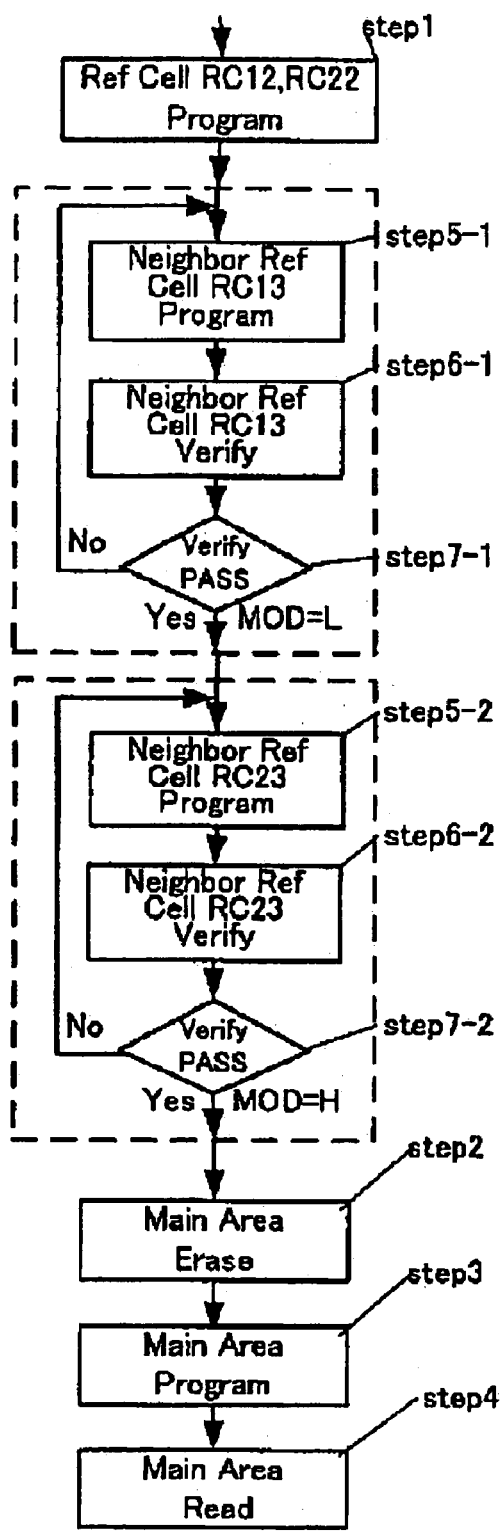
FIG. 12 shows an exemplary algorism for reprogramming and readout operations by the nonvolatile semiconductor memory of Embodiment 7 of the present invention.

FIG. 12 shows an exemplary algorism for reprogramming and readout operations of Embodiment 7 of the present invention. The readout-operation use reference cell RC12 and the programming-verification use reference cell RC22 are first programmed in Step 1 such that these reference cells conduct a predetermined reference current. Subsequently, programming of a neighbor cell of the readout-operation use reference cell is performed in Step 5-1, and the programming of Step 5-1 is verified in Step 6-1 and determined in Step 7-1. Subsequently, programming of a neighbor cell of the programming-verification use reference cell is performed in Step 5-2, and the programming of Step 5-2 is verified in Step 6-2 and determined in Step 7-2. Then, in the reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Steps 5-1 through 7-2 are performed immediately after Step 1. However, Steps 5-1 through 7-2 may be performed whenever before Step 2, and Steps 5-1 through 7-1 and Steps 5-2 through 7-2 are interchangeable.

Figure 11:
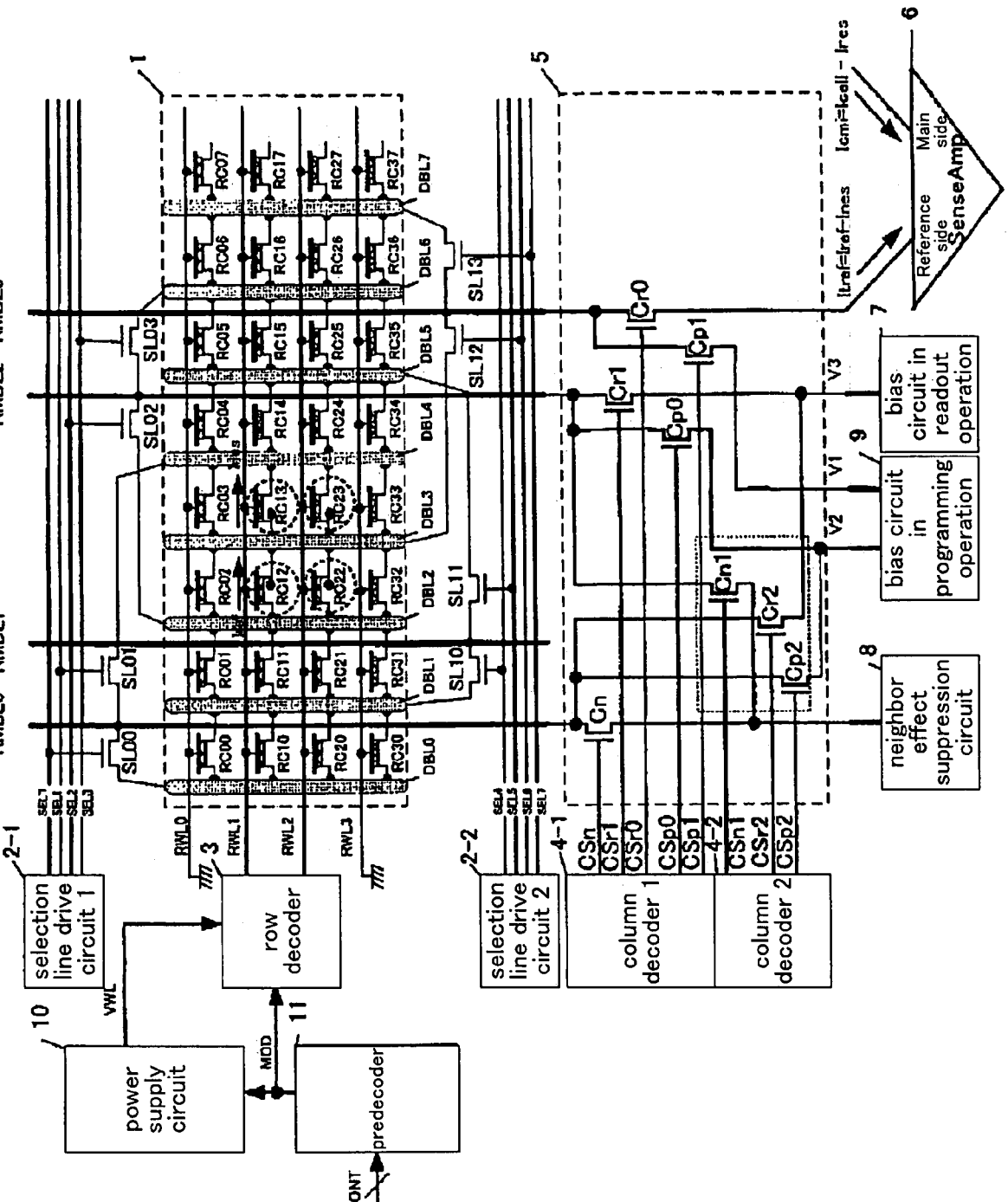
FIG. 11 is a block diagram illustrating a nonvolatile semiconductor memory of Embodiment 7 of the present invention.

FIG. 11 is a block diagram illustrating the nonvolatile semiconductor memory of Embodiment 7 of the present invention.

Since the programming of the reference cell in Step 1, and the readout operation in Step 2, Step 3, and Step 4 using the reference cell are the same as those described in Embodiment 1, descriptions thereof with reference to FIG. 11 are omitted.

Moreover, Steps 5-1 through 7-1 and Steps 5-2 through 7-2 are respectively the same as those described in Embodiment 5. However, in a circuit structure of Embodiment 7, a control signal CONT input to a predecoder 11 differs depending on whether a neighbor cell of the readout-operation use reference cell is to be accessed, or a neighbor cell of the programming-verification use reference cell is to be accessed. The predecoder sets an output signal MOD to a logical value of 0 in the former case and to a logical value of 1 in the latter case. Receiving such signal, a power supply circuit 10 and a row decoder 3 respond as shown in Table 1 below, where a power supply of the row decoder is indicated by VWL which corresponds to a potential of the word line RWL having a logical value of 1.

TABLE 1

| MOD | VWL | RWL1 | RWL2 |
|-----|------|------|------|
| 0   | VWLR | 1    | 0    |
| 1   | VWLP | 0    | 1    |

(VWLP > WVLR)

As to a word line voltage in verifying the programming, in order to determine (identify) a post-programming threshold value, the word line voltage in verifying the programming in Step 6-2 is set to a higher value than that in Step 6-1 so as to set a lower threshold value for a readout use neighbor reference cell RC13 which requires longer operating time and to set a higher threshold value for a programming-verification use neighbor reference cell RC23. As a result, neighbor effect is suppressed, which makes it possible to improve accuracy of the post-programming threshold value of a main cell in Step 3.

As described above, in Embodiment 7 of the present invention, it is possible to set the programming threshold values of neighbor cells to different values according to types of reference cells which the neighbor cells neighbor, and thus optimization of reliability and neighbor effect is possible.

Embodiment 8

The overview of a nonvolatile semiconductor memory of Embodiment 8 of the present invention will be described below with reference to the drawings. According to the nonvolatile semiconductor memory of Embodiment 8, after the nonvolatile semiconductor memory is put on the market, if the threshold value of a neighbor cell degrades, it is possible to automatically reprogram the neighbor cell.

Figure 13:
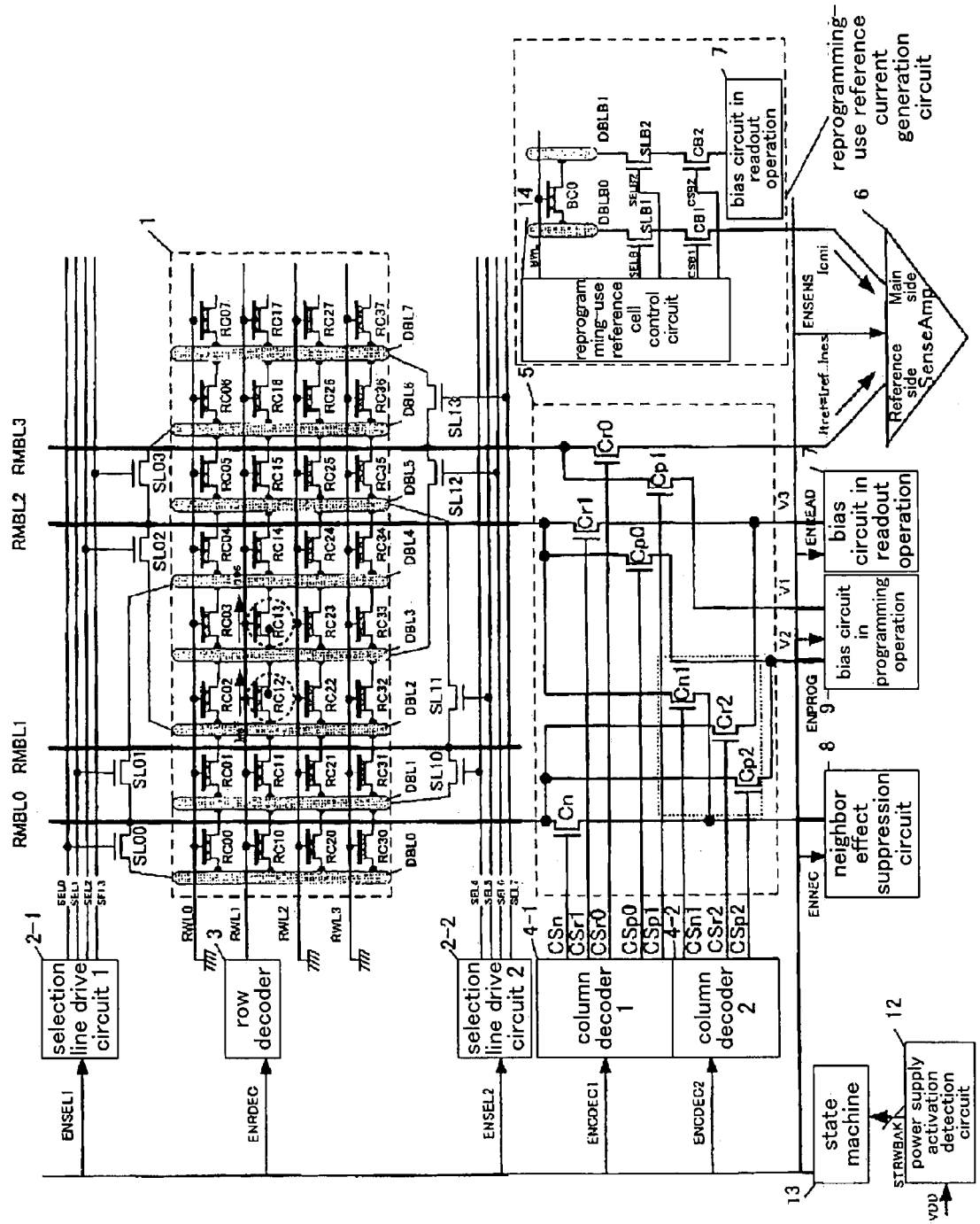
FIG. 13 is a block diagram illustrating a nonvolatile semiconductor memory of Embodiment 8 of the present invention.
Figure 14:
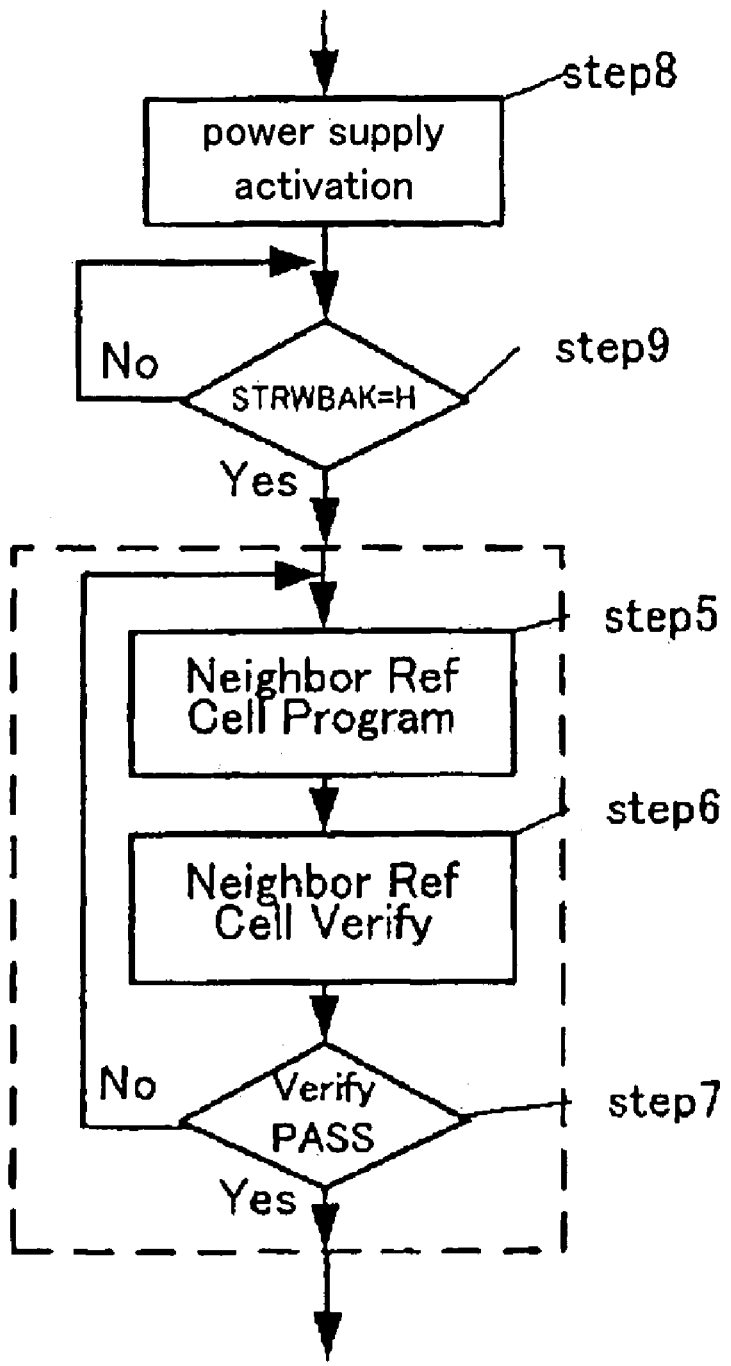
FIG. 14 shows an exemplary algorism of a reprogramming operation on a neighbor cell by the nonvolatile semiconductor memory of Embodiment 8 of the present invention.

FIG. 14 shows an exemplary algorism for a reprogramming operation of Embodiment 8 of the present invention, and FIG. 13 is a block diagram illustrating the nonvolatile semiconductor memory of Embodiment 8.

First, a power supply VDD is activated in Step 8 to output a voltage detection signal STRWBAK. Next, in Step 9, through monitoring whether or not the voltage detection signal STRWBAK is switched to have a logical value of 1, the completion of activation of the power supply is detected. The voltage detection signal STRWBAK is input to a state machine 13 to generate signals for controlling each block at an appropriate timing.

Next, programming of a cell neighboring a reference cell is performed in Step 5, and the programming of Step 5 is verified in Step 6 and determined in Step 7. Then, the reprogramming operation is performed in actual use of the nonvolatile semiconductor memory.

Since Step 5, Step 6, and Step 7 are the same as those described in Embodiment 5, the detailed descriptions thereof are omitted.

In order to verify the programming of the neighbor cell of the reference cell in Step 6 after the nonvolatile semiconductor memory is put on the market, a circuit structure of Embodiment 8 includes a reprogramming use reference current generation circuit. In the reprogramming use reference current generation circuit, an initial state memory cell (which is constant in a neutral state) is used as a constant current source. In verification of the programming of the neighbor cell in Step 6, a reprogramming use reference cell control circuit 14 outputs a word line BWL to activate a memory cell BC0. Next, selection signals SELB1, SELB2, CSB1, and CSB2 are switched to have a logical value of 1, which allows input of a cell current output via the memory cell BC0 from a readout bias circuit 7 to a main side input of a sense amplifier 6, the cell current input to the sense amplifier 6 being used as a reference current in Step 6.

As described above, Embodiment 8 of the present invention includes the power source activation detection circuit 12 and the sequencer circuit to automatically reprogram a neighbor cell having a decreased threshold value at the time of power supply activation. Therefore, it possible to automatically reprogram the neighbor cell after the nonvolatile semiconductor memory is put on the market and to facilitate reliability design.

Note that, descriptions of the reprogramming use reference current generation circuit have been given with reference to a case where a memory cell is used therein. However, it is possible to generate a reference current using a general transistor or passive component (for example, resistor or capacitor).

Embodiment 9

The overview of a nonvolatile semiconductor memory of Embodiment 9 of the present invention will be described below with reference to the drawings. According to the nonvolatile semiconductor memory of Embodiment 9, it is possible to facilitate a mechanism for reprogramming a neighbor cell when the threshold value thereof degrades.

Figure 15:
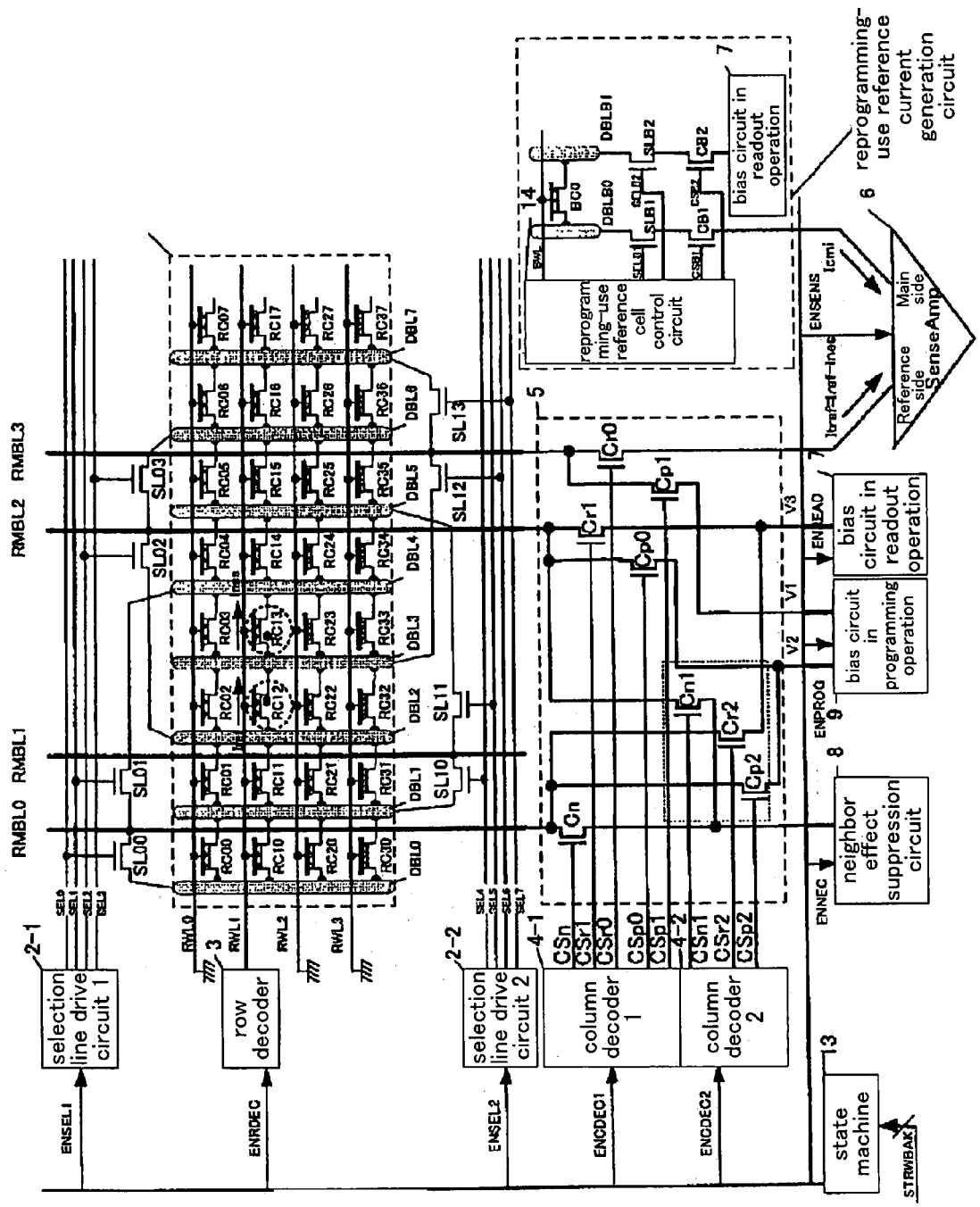
FIG. 15 is a block diagram illustrating a nonvolatile semiconductor memory of Embodiment 9 of the present invention.
Figure 16:
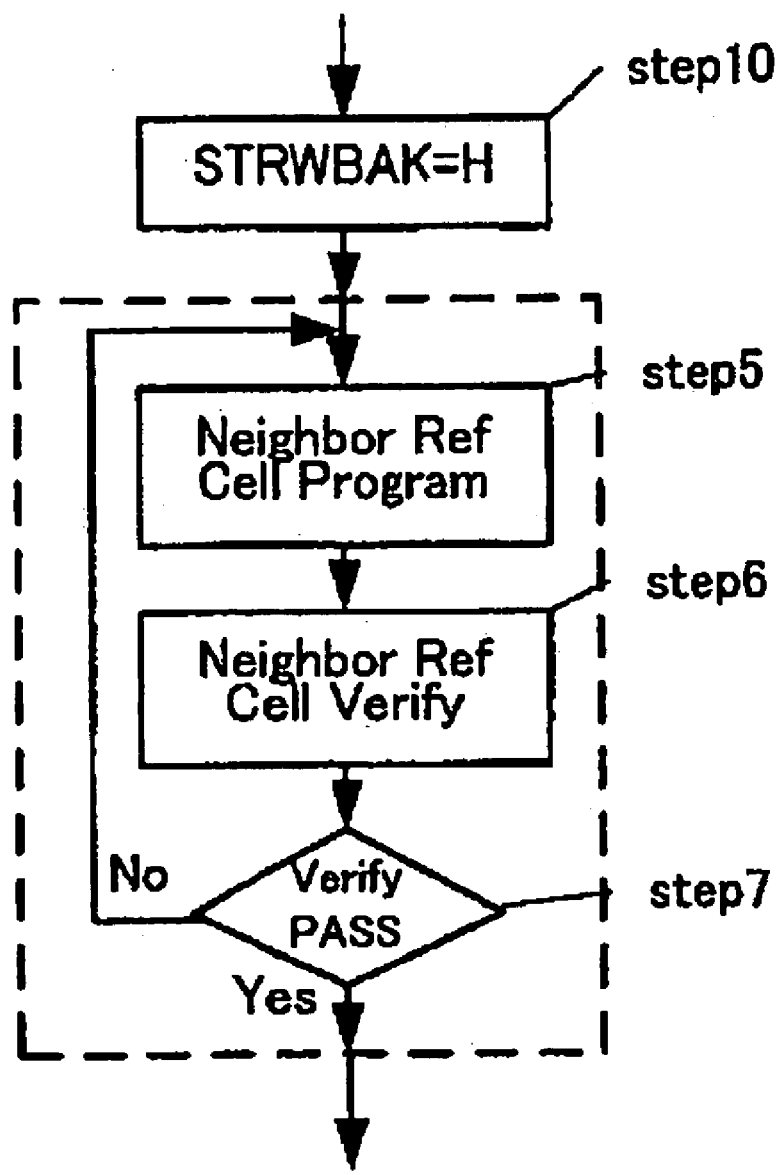
FIG. 16 shows an exemplary algorism of a reprogramming operation on a neighbor cell by the nonvolatile semiconductor memory of Embodiment 9 of the present invention.

FIG. 16 shows an exemplary algorism for a reprogramming operation of Embodiment 9 of the present invention, and FIG. 15 is a block diagram of the nonvolatile semiconductor memory of Embodiment 9.

First, in Step 10, a reprogramming signal STRWBAK is set from the outside to have a logical value of 1. Next, the reprogramming signal STRWBAK is input to a state machine 13 which generates signals for controlling each block at an appropriate timing.

Next, programming of a neighbor cell of a reference cell is performed in Step 5, and the programming of Step 5 is verified in Step 6 and determined in Step 7. Then, the reprogramming operation is performed in actual use of the nonvolatile semiconductor memory.

Since Step 5, Step 6, and Step 7 are the same as those described in Embodiment 8, the detailed descriptions thereof are omitted.

As described above, in Embodiment 9 of the present invention, a neighbor cell having a decreased threshold value is reprogrammed under external control. Although this structure requires the external control compared to that of Embodiment 8, this structure can be realized more simply without the power source activation detection circuit.

Embodiment 10

The overview of a nonvolatile semiconductor memory of Embodiment 10 of the present invention will be described below with reference to the drawings. According to the nonvolatile semiconductor memory of Embodiment 10, in a source sense system, all neighbor cells connected to a bit line at a common source side are programmed to reduce the neighbor effect caused by over erase currents of all the neighbor cells connected to a subbit line at the common source side.

Figure 17:
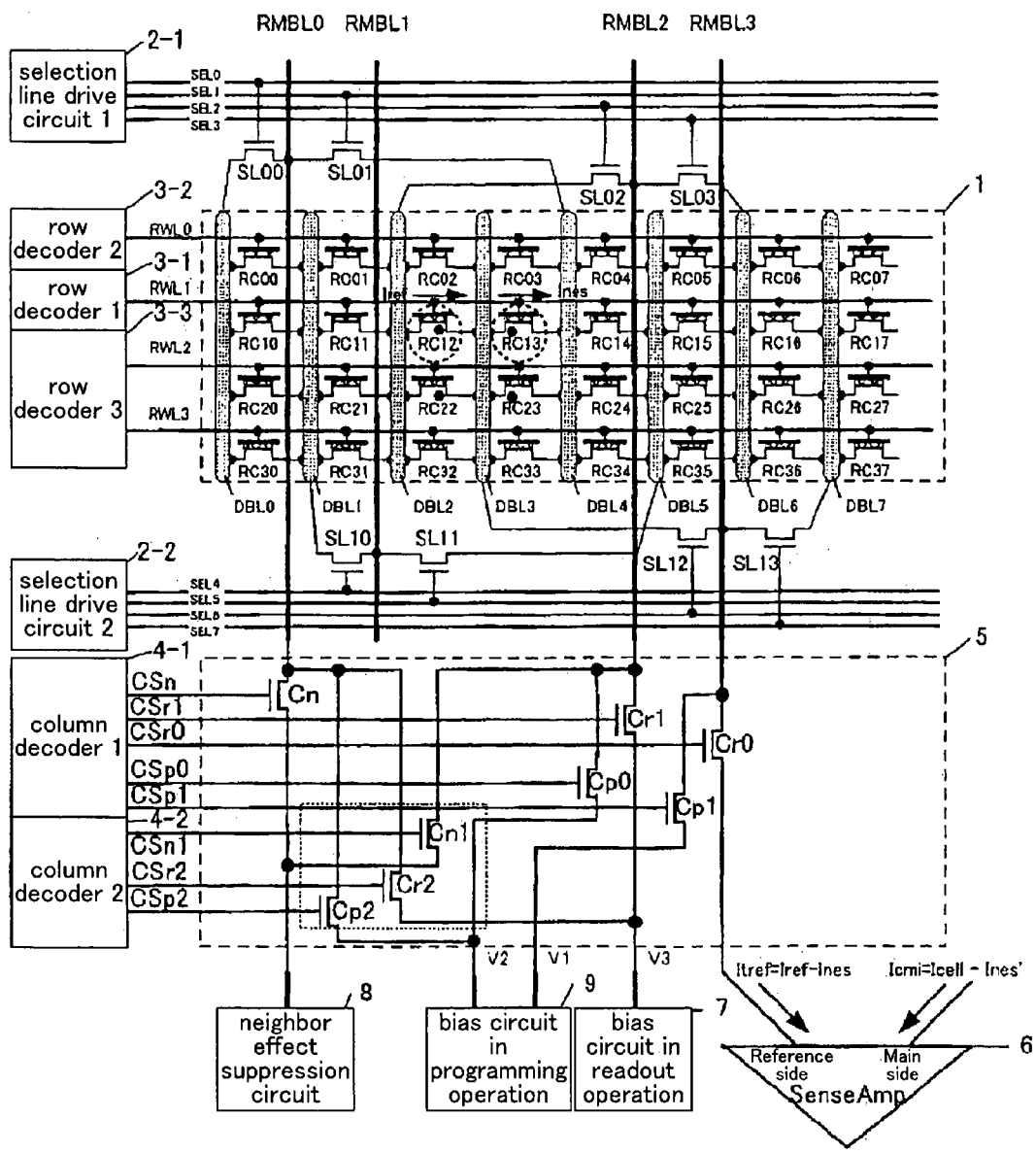
FIG. 17 is a block diagram illustrating a nonvolatile semiconductor memory of Embodiment 10 of the present invention.
Figure 18:
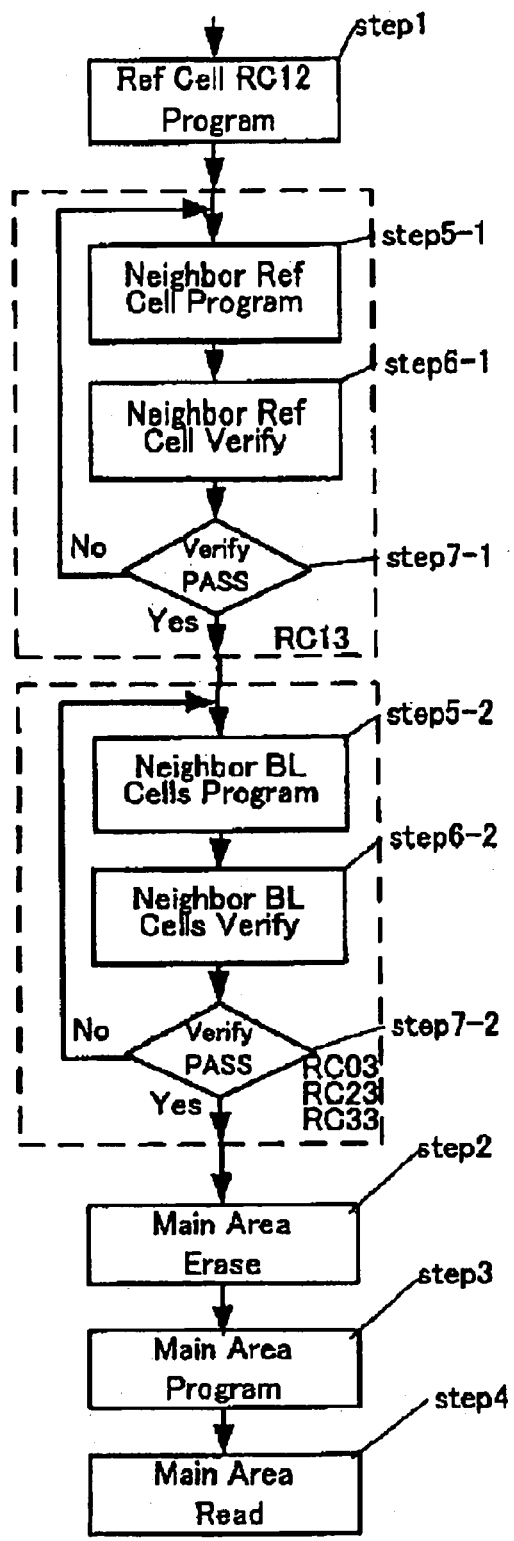
FIG. 18 shows an exemplary algorism for reprogramming and readout operations by the nonvolatile semiconductor memory of Embodiment 10 of the present invention.

FIG. 18 shows an exemplary algorism for reprogramming and readout operations of Embodiment 10 of the present invention. A readout-operation use reference cell RC12 is first programmed in Step 1 such that the readout-operation use reference cell RC12 conducts a predetermined reference current. Subsequently, programming of a neighbor cell is performed in Step 5-1, and the programming of Step 5-1 is verified in Step 6-1 and determined in Step 7-1. Then, as shown in the block diagram of FIG. 17 illustrating the nonvolatile semiconductor memory of Embodiment 10, row decoders 3-2 and 3-3 sequentially activate word lines RWL0, RWL2, and RWL3 such that programming of all neighbor cells connected to a bit line at a common source side is performed in Step 5-2, and the programming of Step 5-2 is verified in Step 6-2 and determined in Step 7-2 subsequently. Then, in the reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Steps 5-1 through 7-2 are performed immediately after Step 1. However, Steps 5-1 through 7-2 may be performed whenever before Step 2, and Steps 5-1 through 7-1 and Steps 5-2 through 7-2 are interchangeable.

In FIG. 17, the programming of the reference cell in Step 1, the readout operation in Step 2, Step 3, and Step 4 using the reference cell, and the Steps 5-1 thorough 7-1 and the Steps 5-2 through 7-2 are the same as those described in Embodiment 5. However, in a circuit structure of Embodiment 10, all the neighbor cells connected to the bit line at the common source side are to be accessed and programmed to reduce an over erase leak cell current which flows out via the common source line. Therefore, it is possible to reduce variation in reference side input current to a sense amplifier 6.

According to the above-mentioned structure, in Embodiment 10 of the present invention, it is possible to reduce the neighbor effect caused by the over erase currents of all the neighbor cells connected to the subbit line at the common source side in the source sense system.

Embodiment 11

The overview of a nonvolatile semiconductor memory of Embodiment 11 of the present invention will be described below with reference to the drawings. According to the nonvolatile semiconductor memory of Embodiment 11, in a drain sense system, all neighbor cells connected to a bit line at a common drain side are programmed to reduce the neighbor effect caused by over erase currents of all the neighbor cells connected to a subbit line at the common drain side.

Figure 19:
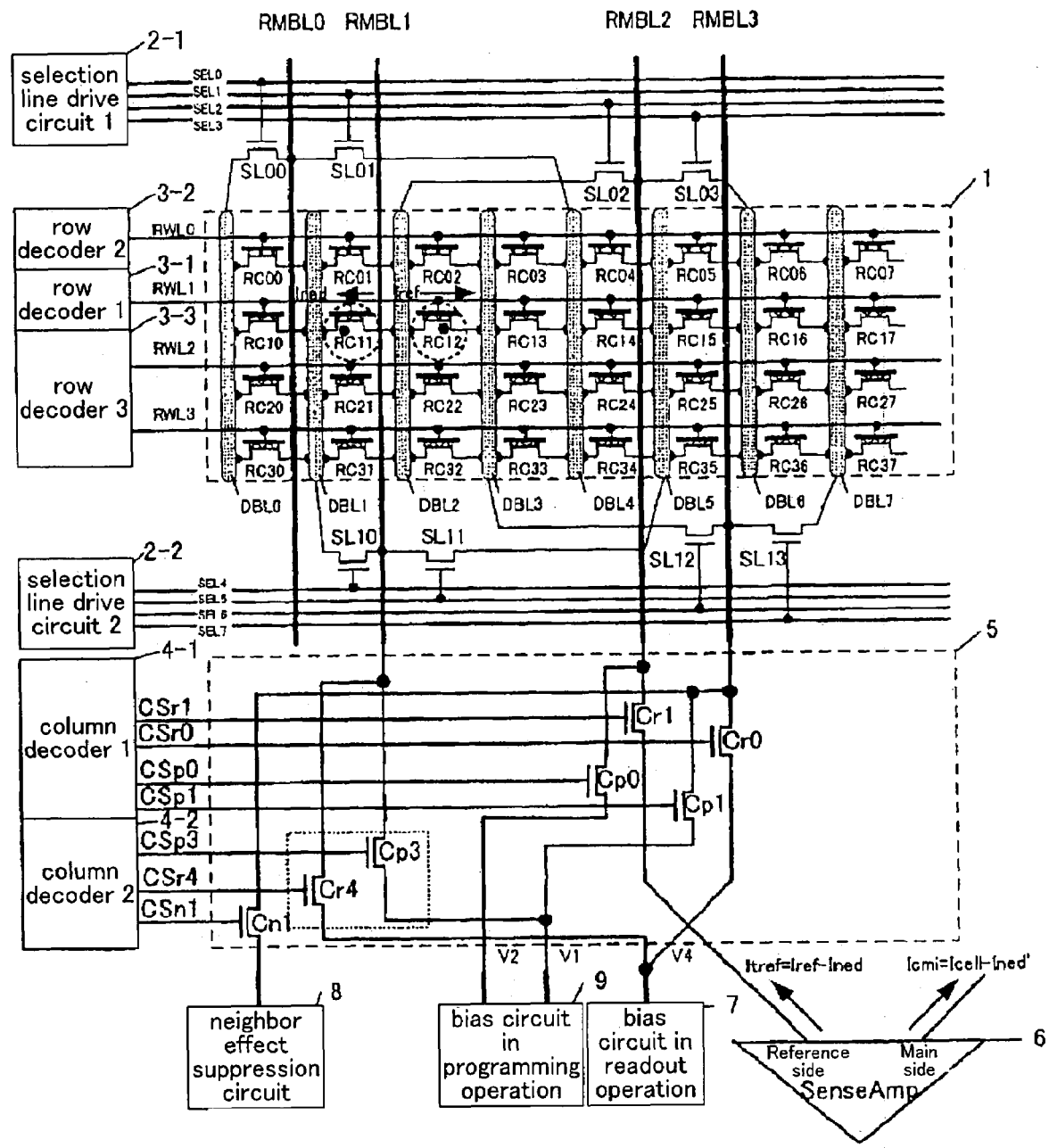
FIG. 19 is a block diagram illustrating a nonvolatile semiconductor memory of Embodiment 11 of the present invention.
Figure 20:
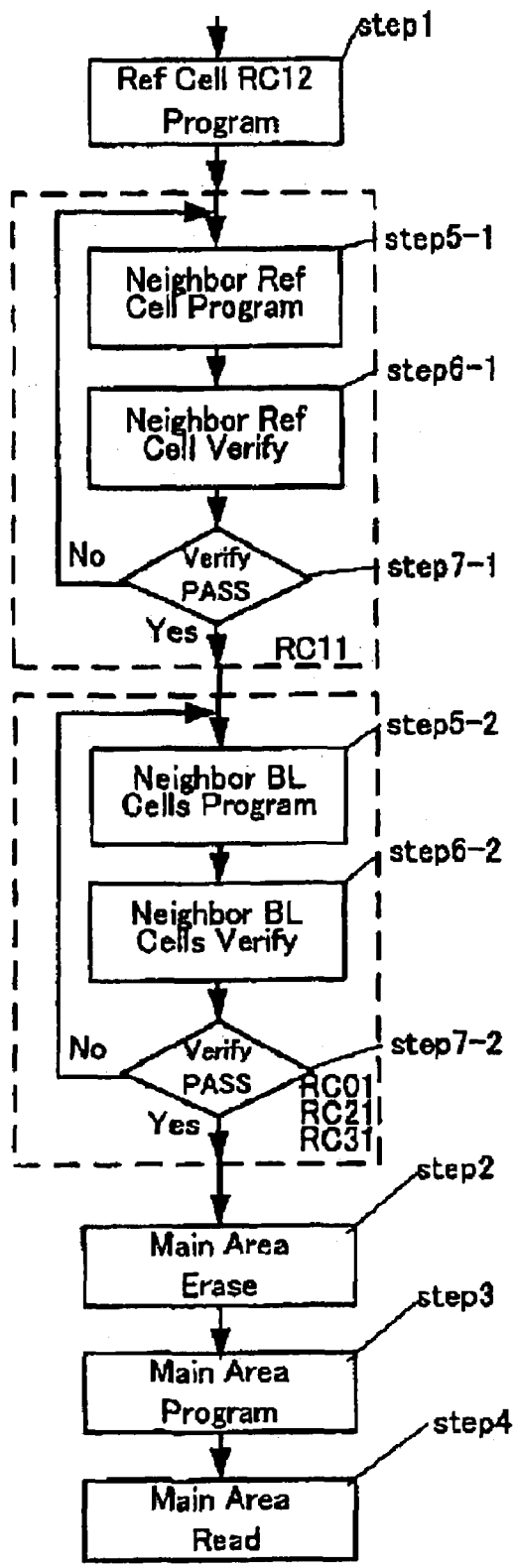
FIG. 20 shows an exemplary algorism for reprogramming and readout operations by the nonvolatile semiconductor memory of Embodiment 11 of the present invention.

FIG. 20 shows an exemplary algorism for reprogramming and readout operations of Embodiment 11 of the present invention. A readout-operation use reference cell RC12 is first programmed in Step 1 such that the readout-operation use reference cell RC12 conducts a predetermined reference current. Subsequently, programming of a neighbor cell is performed in Step 5-1, and the programming of Step 5-1 is verified in Step 6-1 and determined in Step 7-1. Then, as shown in the block diagram of FIG. 19 illustrating the nonvolatile semiconductor memory of Embodiment 11, row decoders 3-2 and 3-3 sequentially activate word lines RWL0, RWL2, and RWL3 such that programming of all neighbor cells connected to a bit line at a common drain side is performed in Step 5-2, and the programming of Step 5-2 is verified in Step 6-2 and determined in Step 7-2 subsequently. Then, in the reprogramming operation in actual use of the nonvolatile semiconductor memory, an erase operation in Step 2, a programming operation in Step 3, and a readout operation in Step 4 are performed on a main area.

Note that, Step 1, Step 2, and Step 3 may involve a verify action for level adjustment.

It is shown a case where Steps 5-1 through 7-2 are performed immediately after Step 1. However, Steps 5-1 through 7-2 may be performed whenever before Step 2, and Steps 5-1 through 7-1 and Steps 5-2 through 7-2 are interchangeable.

In FIG. 20, the programming of the reference cell in Step 1, the readout operation in Step 2, Step 3, and Step 4 using the reference cell, and the Steps 5-1 thorough 7-1 and the Steps 5-2 through 7-2 are the same as those described in Embodiment 6. However, in a circuit structure of Embodiment 11, all the neighbor cells connected to the bit line at the common drain side are to be accessed and programmed to reduce an over erase leak cell current which flows out via a common drain line. Therefore, it is possible to reduce variation in reference side current of a sense amplifier 6.

According to the above-mentioned structure, in Embodiment 11 of the present invention, it is possible to reduce the neighbor effect caused by the over erase currents of all the neighbor cells connected to the subbit line at the common drain side in the drain sense system.

Embodiment 12

The overview of a nonvolatile semiconductor memory of Embodiment 12 of the present invention will be described below with reference to the drawings. The nonvolatile semiconductor memory of Embodiment 12 includes a selection means for outputting a current flowing through a common source to the outside to facilitate characteristic evaluation of the neighbor effect current in a source sense system.

Figure 21:
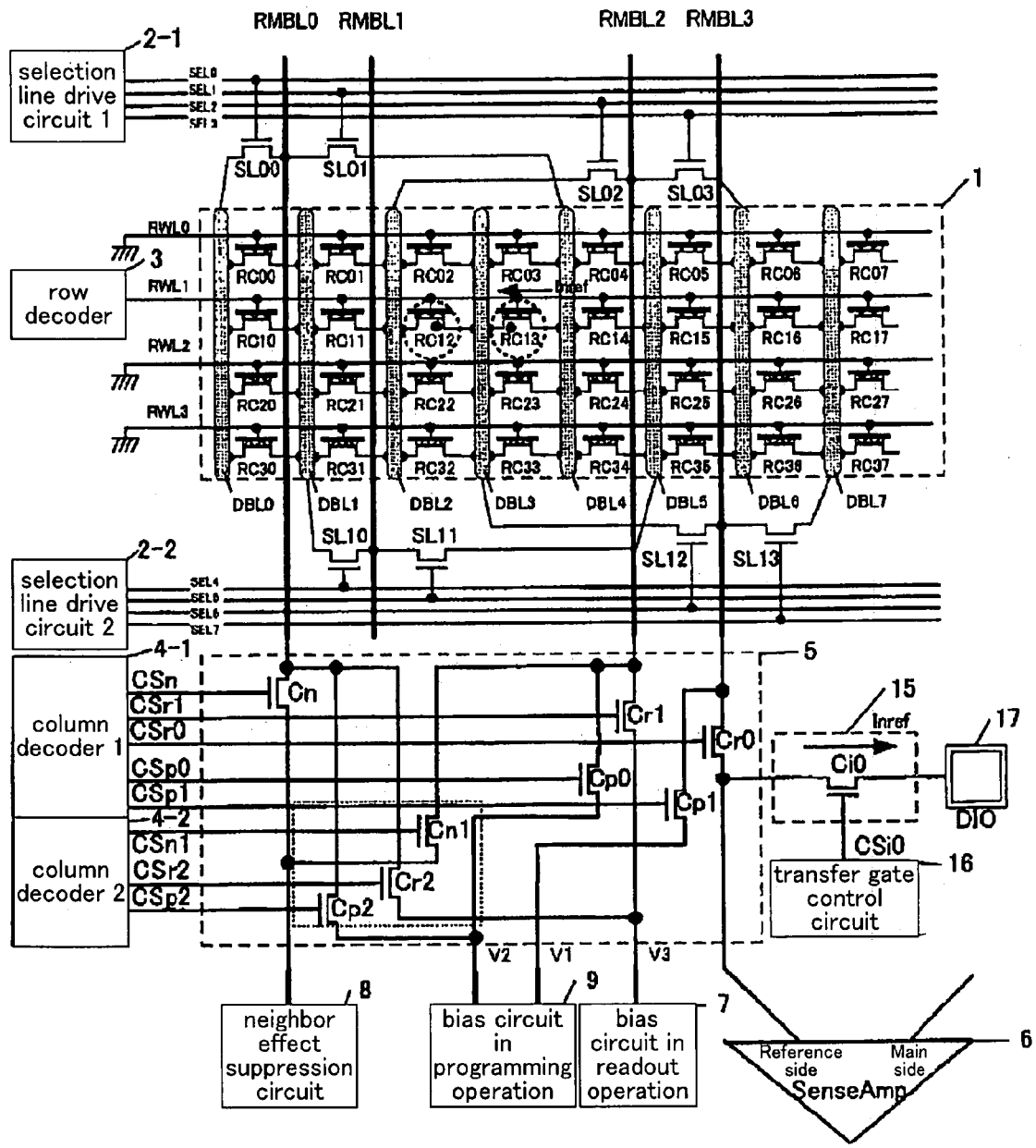
FIG. 21 is a block diagram illustrating a nonvolatile semiconductor memory of Embodiment 12 of the present invention.

FIG. 21 is a block diagram illustrating the nonvolatile semiconductor memory of Embodiment 12 of the present invention, and the operation of measuring a neighbor cell current will be explained.

A row decoder 3 selects a word line RWL1 to select a neighbor cell RC13. In this state, a column decoder 4 drives column selection lines CSr2 and CSr0 to have a logical value of 1, which allows application of a voltage V3=Vb generated in a readout bias circuit 7 to a main bit line RMBL0 via a column selection transistor Cr2 and connection of a main bit line RMBL3 to an input terminal of a transfer gate Ci0 via a column selection transistor Cr0. At the same time, selection line drive circuit 2-1 and 2-2 drive block selection lines SEL6 and SEL1 to have a logical value of 1, which allows connection of a subbit line DBL3 to the input terminal of the transfer gate Ci0 via a block selection transistor SL12 and application of the Vb to a subbit line DBL4 via a block selection transistor SL01. In this way, a control signal SCi0 from a transfer gate control circuit 16 is set to have a logical value of 1, so that a neighbor current Inref is output to an output terminal 17.

According to the above-mentioned structure, in Embodiment 12 of the present invention, external measurement of the neighbor current in the source sense, system is possible, which makes it possible to facilitate the characteristic evaluation of the cell.

Embodiment 13

The overview of a nonvolatile semiconductor memory of Embodiment 13 of the present invention will be described below with reference to the drawings. The nonvolatile semiconductor memory of Embodiment 13 includes a selection means for outputting a current flowing into a common drain to the outside to facilitate characteristic evaluation of the neighbor effect current in a drain sense system.

Figure 22:
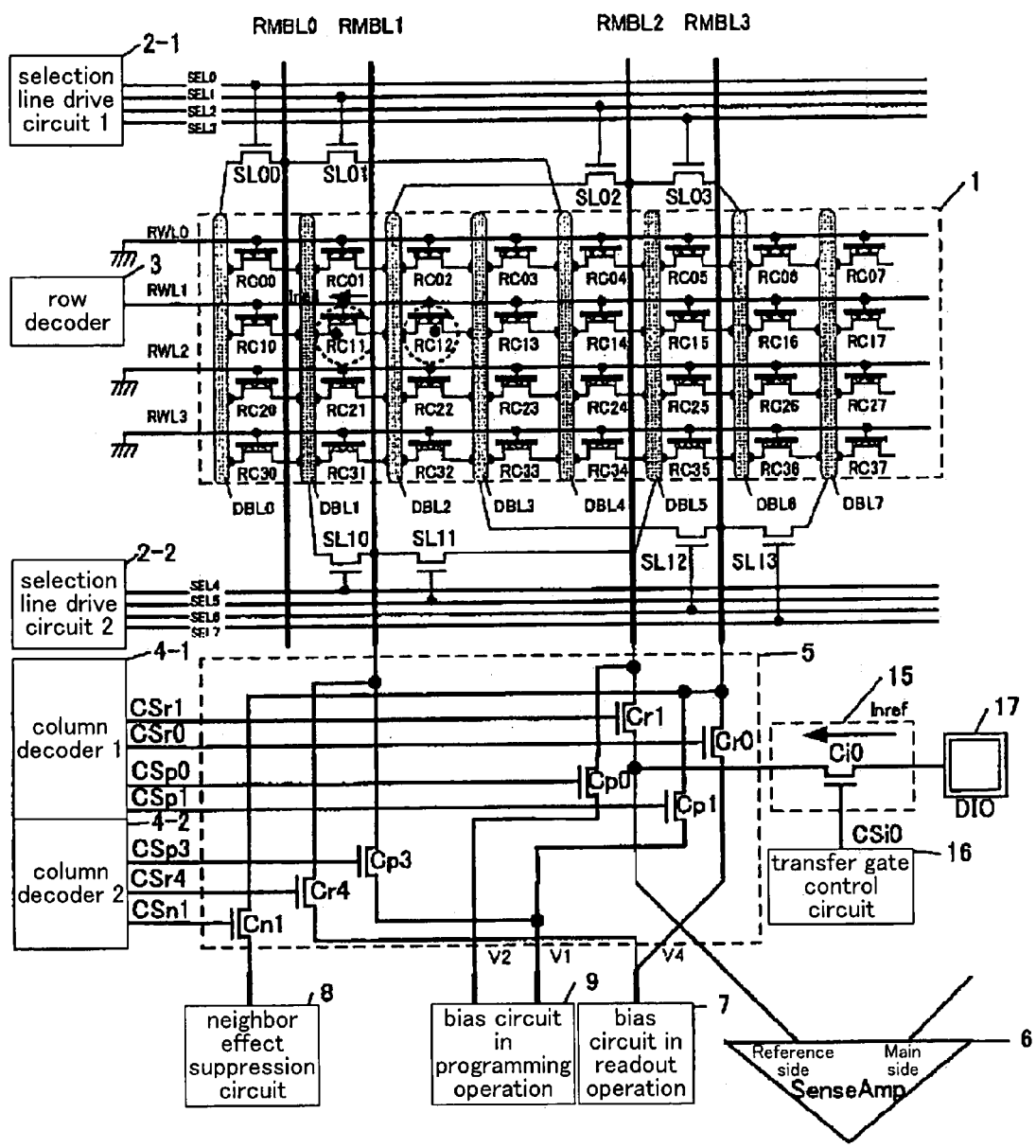
FIG. 22 is a block diagram illustrating a nonvolatile semiconductor memory of Embodiment 13 of the present invention.
Figure 23:
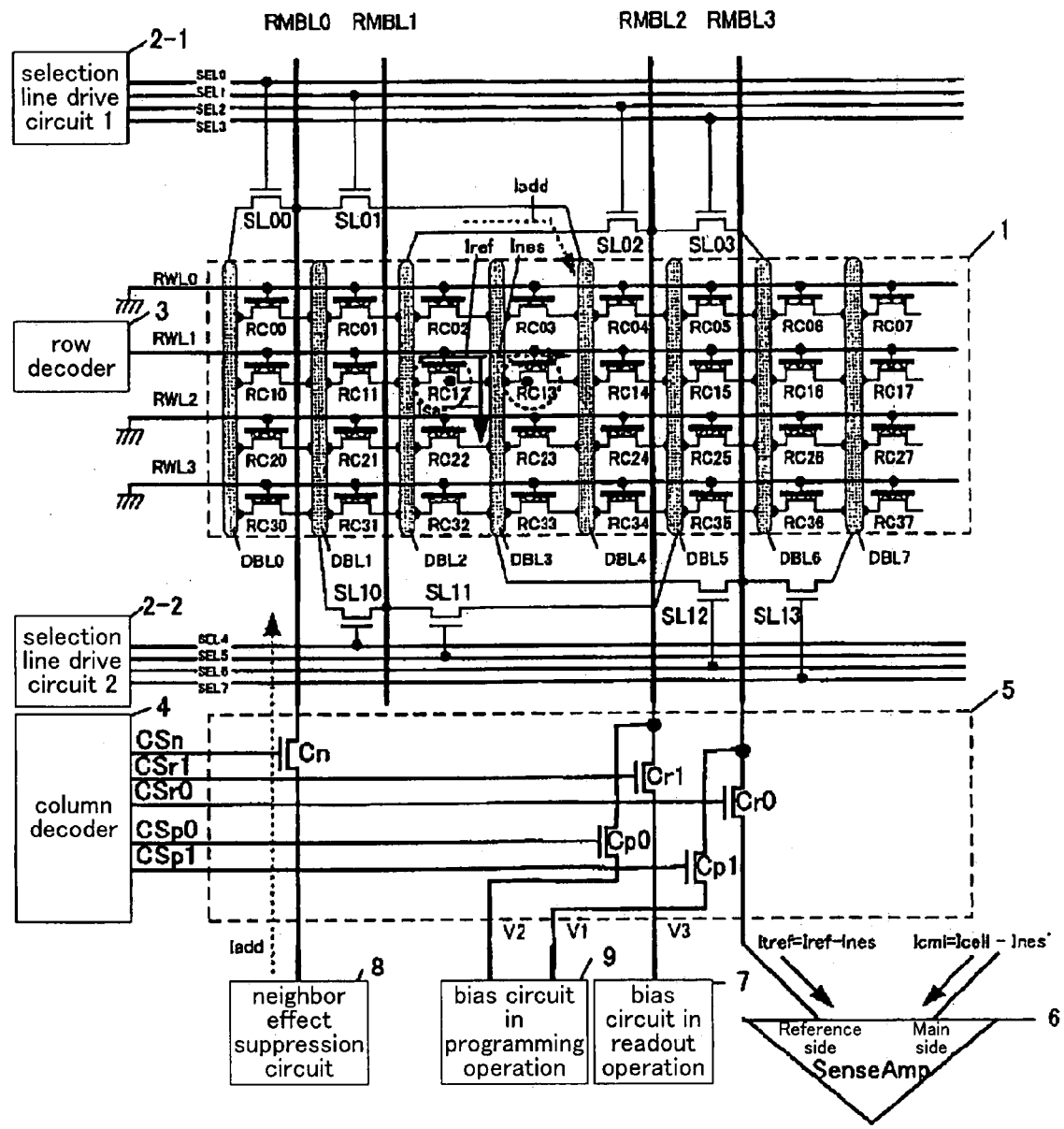
FIG. 23 is a block diagram illustrating a conventional nonvolatile semiconductor memory.
Figure 24:
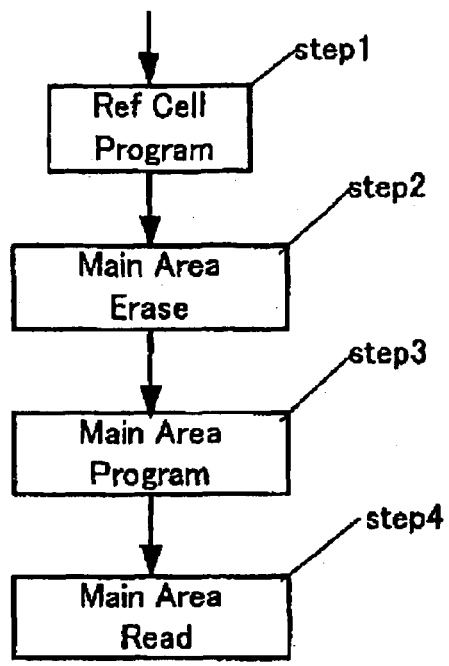
FIG. 24 shows an exemplary algorism for reprogramming and readout operations by the conventional nonvolatile semiconductor memory.
Figure 25:
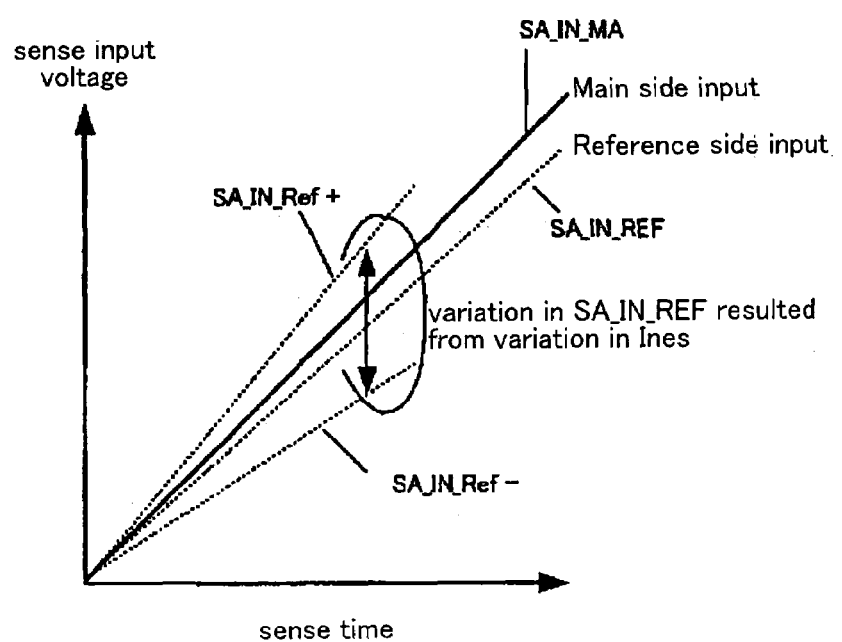
FIG. 25 is a graph with which a readout determination operation of the conventional nonvolatile semiconductor memory is explained.

FIG. 22 is a block diagram illustrating the nonvolatile semiconductor memory of Embodiment 13 of the present invention, and the operation of measuring a reference cell current will be explained.

A row decoder 3 selects a word line RWL1 to select a neighbor cell RC11. In this state, a column decoder 4 drives column selection lines CSr1 and CSr4 to have a logical value of 1, which allows connection of a main bit line RMBL2 to an input terminal of a transfer gate Ci0 via a column selection transistor Cr1 and application of a voltage V4=VSS generated in a readout bias circuit 7 to a main bit line RMBL1 via a column selection transistor Cr4. At the same time, selection line drive circuit 2-1 and 2-2 drive block selection lines SEL2 and SEL4 to have a logical value of 1, which allows connection of a subbit line DBL2 to the input terminal of the transfer gate Ci0 via a block selection transistor SL02 and application of the VSS to a subbit line DBL1 via a block selection transistor SL10. In this way, a control signal SCi0 from a transfer gate control circuit 16 is set to have a logical value of 1, so that a neighbor current Ined is output to an output terminal 17.

According to the above-mentioned structure, in Embodiment 13 of the present invention, external measurement of the neighbor current in the drain sense system is possible, which makes it possible to facilitate the characteristic evaluation of the cell.

Effects obtained from the representative examples of the invention disclosed in the present application will be explained as follows.

In a source sense system and in a drain sense system, a mechanism for programming a memory cell neighboring a reference cell is provided, which enables reduction in neighbor current. As a result, it is possible to improve a margin in readout operation and to achieve stabilization.

A means for verifying the threshold value of a neighbor cell is provided, which makes it possible to improve degradation in threshold value (reliability) of the neighbor cell and to achieve optimization according to types of reference cells.

A mechanism for reprogramming the neighbor cell through internal detection or external control and a means for generating a reference current used in the reprogramming are provided to enable the reprogramming after the nonvolatile semiconductor memory is put on the market. Therefore, it possible to ease the specification required for the neighbor cell and to facilitate reliability design.

Further, a word line decoding means for programming all neighbor cells connected to the source or the drain of a reference cell is provided to reduce the neighbor effect caused by over erase currents. Therefore, it is possible to improve a margin in the readout operation and to achieve stabilization.

Furthermore, a circuit mechanism for externally monitoring a cell current of the neighbor cell is provided, which makes it possible to facilitate the characteristic evaluation and analysis of the cell current of the neighbor cell.

A nonvolatile semiconductor memory of the present invention has effects that data can be accurately determined while increase in area of a circuit is suppressed, and is applicable as, for example, a nonvolatile semiconductor memory having a memory cell region in which memory cells and a reference cell are arranged in rows and columns.

What is claimed is:

1. A nonvolatile semiconductor memory of virtual ground array in which a common connection of the sources and a common connection of the drains of nonvolatile memory cells arranged in rows and columns in a memory cell array are used as bit lines, the nonvolatile memory cells including:
    a reference cell from which a characteristic used as a reference in a differential readout determination operation is obtained; and
    a neighbor cell at one side of the reference cell, the neighbor cell sharing one of the source and the drain of the reference cell and being connected to a word line which is connected to the reference cell, wherein
    the nonvolatile semiconductor memory includes a neighbor cell programming circuit to set the neighbor cell to a programmed state when the word line is activated to set the reference cell to a conduction state, the neighbor cell being kept in a non-conduction state during the programmed state.

2. A nonvolatile semiconductor memory of claim 1, wherein the programming circuit applies a programming voltage between the source and the drain of the neighbor cell.

3. A nonvolatile semiconductor memory of claim 1, wherein
    in the readout determination operation,
    a sense amplifier is coupled to the one of the source and the drain of the reference cell shared by the neighbor cell, and
    a power supply circuit is coupled to the other of the source and the drain of the reference cell.

4. A nonvolatile semiconductor memory of claim 3, wherein the nonvolatile memory cells further include
    an other-side neighbor cell, the other-side neighbor cell sharing the other of the source and the drain of the reference cell and being connected to the word line which is connected to the reference cell, and
    wherein the neighbor cell programming circuit is further able to set the other-side neighbor cell to a programmed state when the word line is activated to set the reference cell to a conduction state, the other-side neighbor cell being kept in a non-conduction state during the programmed state.

5. A nonvolatile semiconductor memory of claim 3, wherein to enable verification of the neighbor cell,
    the sense amplifier is coupled to one of the source and the drain of the neighbor cell shared by the reference cell, and
    a power supply circuit is coupled to the other of the source and drain of the neighbor cell.

6. A nonvolatile semiconductor memory of claim 5, further comprising
    another reference cell and another neighbor cell connected to another word line which is different from the word line of the reference cell and the neighbor cell,
    wherein potentials of the word lines in verification of each of the neighbor cells are variable with respect to each other.

7. A nonvolatile semiconductor memory of claim 5, wherein the neighbor cell is programmed and verified according to a predetermined control signal.

8. A nonvolatile semiconductor memory of claim 7, wherein the control signal is provided at the time of power source activation of the nonvolatile semiconductor memory.

9. A nonvolatile semiconductor memory of claim 5, wherein
    the nonvolatile memory cells further include another neighbor cell which shares one of the source and the drain of the reference cell and is connected to another word line which is different from the word line of the reference cell, and
    the neighbor cell programming circuit further enables to set the other-side neighbor cell to a programmed state when each of the word lines is activated, the other-side neighbor cell being kept in a non-conduction state during the programmed state.

10. A nonvolatile semiconductor memory of claim 1, wherein a current flowing at the time of connection of a power supply circuit to one of the source and the drain of the neighbor cell is measurable from the outside of the nonvolatile semiconductor memory.

* * * * *